United States Patent [19]

Miyachi et al.

[11] Patent Number: 5,194,398
[45] Date of Patent: Mar. 16, 1993

[54] SEMICONDUCTOR FILM AND PROCESS FOR ITS PRODUCTION

[75] Inventors: Kenji Miyachi; Nobuhiro Fukuda; Yoshinori Ashida, all of Yokohama; Masato Koyama, Kamakura, all of Japan

[73] Assignee: Mitsui Toatsu Chemicals, Inc., Tokyo, Japan

[21] Appl. No.: 830,967

[22] Filed: Feb. 6, 1992

Related U.S. Application Data

[63] Continuation of Ser. No. 545,176, Jun. 28, 1990, abandoned.

[30] Foreign Application Priority Data

| Jun. 28, 1989 | [JP] | Japan | 1-163710 |
| Jun. 29, 1989 | [JP] | Japan | 1-165402 |
| Jun. 29, 1989 | [JP] | Japan | 1-165403 |
| Aug. 2, 1989 | [JP] | Japan | 1-199258 |
| Aug. 2, 1989 | [JP] | Japan | 1-199259 |
| Aug. 2, 1989 | [JP] | Japan | 1-199260 |
| Aug. 3, 1989 | [JP] | Japan | 1-200834 |
| Jan. 23, 1990 | [JP] | Japan | 2-11803 |

[51] Int. Cl.$^5$ .................. H01L 21/20; H01L 21/203; H01L 21/205
[52] U.S. Cl. .................. 437/108; 437/101; 437/109; 437/937; 136/258
[58] Field of Search .............. 204/157.45–157.48, 204/192.25, 192.3, 192.31, 192.37; 427/39, 51, 54.1, 74, 249; 437/100–101, 108–110, 937; 428/620; 136/258 AM; 148/33, 33.2, DIG. 1; 156/643

[56] References Cited

U.S. PATENT DOCUMENTS

4,402,762 9/1983 John et al. .
4,968,384 11/1990 Asano .................. 156/643
4,986,213 1/1991 Yamazaki et al. .............. 118/719

FOREIGN PATENT DOCUMENTS

63-14420 1/1988 Japan .

OTHER PUBLICATIONS

K. Takahashi et al, "Amorphous Silicon Solar Cells", J. Wiley (New York 1986), pp. 114 and 118.
A. Asano et al, *J. Appl. Phys.*, vol. 65, No. 6, Mar. 1989, pp. 2439–2444.
M. Pinarbasi et al, *Thin Solid Films*, vol. 171, No. 1, Apr. 1989, pp. 217–233.

*Primary Examiner*—Aaron Weisstuch
*Attorney, Agent, or Firm*—Millen, White, Zelano and Branigan

[57] ABSTRACT

A method for forming an amorphous semiconductor film, which comprises (a) a film-forming step of forming a semiconductor film having not more than 20 atomic percent of bound hydrogen to a thickness of 3 to 1000 Å, and (b) a modifying step of modifying the formed film, the steps being repeated multiple times.

30 Claims, 16 Drawing Sheets

SEMICONDUCTOR FILM AND PROCESS FOR ITS PRODUCTION

This application is a continuation of application Ser. No. 07/545,176, filed Jun. 28, 1990, now abandoned.

BACKGROUND OF THE INVENTION

1. Field of the Invention

This invention relates to a technology of improving the quality of an amorphous conductor film constituting a solar cell.

Amorphous solar cells have already gained widespread practical acceptance as an energy-supplying source having a small output for driving electronic portable calculators or watches. However, for large outputs of 0.1 W or higher for solar light power generation applications, amorphous semiconductor films having satisfactory performance and stability have not been developed as an energy-supply source. Much work is being done for increased performance. This problem is essential to an amorphous hydrogenated silicon film, formed by such film-forming methods as a plasma CVD method, a photo CVD method, or a thermal CVD method, and a further improvement in performance was considered to be difficult.

For a solution to this problem, Japanese Laid-Open Patent Publication No. 14420/1988 disclose a process wherein the formation of a film and its plasma treatment with hydrogen or a halogenating substance is repeated. The improvement achieved by this technique has not been satisfactory. The present inventors considered that the main cause of this problem is that a large amount of bound hydrogen is involved during film formation to form an amorphous hydrogenated silicon. Furthermore, the present inventors considered the fact that most semiconductor films constituting amorphous solar cells now in practical use are formed by the plasma CVD method, and searched for a method which enables the plasma CVD method to be used in addition to other methods in a film-forming step.

As a result, the present inventors found that a semiconductor having a narrow optical band gap with a small amount of bound hydrogen can be obtained by repeating a step of improving the properties of the film, for example, comprising forming a semiconductor film having a specified amount of bound hydrogen to a specified thickness, and exposing the film to a discharge atmosphere containing a reactive gas, whereby the electro-optical properties of the resulting semiconductor film are much better than a conventional Si film.

SUMMARY OF THE INVENTION

The present invention provides a process for forming an amorphous semiconductor film, which comprises (a) a film-forming step of forming a semiconductor film containing not more than 20 atomic percent of bound hydrogen to a thickness of 3 to 1000 Å, and (b) a step of modifying the resulting film, (c) the steps (a) and (b) each being repeated multiple times; and a high-quality amorphous semiconductor film formed by the above process.

The present invention also provides a process for forming an amorphous semiconductor film, which comprises (a) a film-forming step of forming a silicon semiconductor film to a thickness of 1 to 100 Å, (b) a step of modifying by dehalogenating-hydrogenating the resulting film, (c) the steps (a) and (b) each being repeated multiple times; and a high-quality amorphous semiconductor film formed by the above process.

DETAILED DESCRIPTION OF THE INVENTION

The present invention will now be described in detail.

The film-forming step of this invention is not particularly limited. Specifically, it is a step of film formation by a physical deposition method such as vacuum evaporation, sputtering, or ion plating, or a chemical vapor deposition method such as photo CVD or plasma CVD.

The modifying step in this invention is a step in which the film formed is exposed to discharge atmosphere containing a non-film-forming reactive gas, a monovalent ion, or atomic hydrogen to improve the properties of the semiconductor film.

In the process of this invention, the film-forming step and the modifying step are repeated. In the film-forming step, it is important to form a semiconductor film containing not more than 20 atomic percent of combined hydrogen, and it is important that the thickness of a semiconductor film formed by one formation/modification cycle is adjusted to 5 to 1000 Å, preferably 10 to 100 Å, more preferably to 10 to 80 Å, and especially to 30 to 50 Å. Other film-forming conditions do not essentially impair the effects of this invention.

An effective method of physically forming a film will be described below.

The starting material (target) for film formation in this invention includes silicon and compounds or alloys of elements such as silicon carbide, silicon nitride, and silicon-germanium alloy (or composite powder), or silicon-tin alloy (or composite powder). Essentially hydrogen-free substances can be effectively used. Elements such as carbon, germanium or tin, and compounds or alloys thereof may also be used. The film-forming conditions are not particularly limited except that the amount of hydrogen combined is smaller than usual in this invention. The amount of combined hydrogen in the semiconductor film is not more than 20 atomic percent, preferably not more than 10 atomic percent but at least 0 atomic percent. If these conditions are fulfilled, the film-formation may be effected in an atmosphere of an inert gas, hydrogen, a hydrocarbon, fluorine or oxygen gas. The specific conditions are that the flow rate of the gas is 1 to 100 sccm, and the reaction pressure is 0.001 mtorr to 100 mtorr. Depending upon the film-forming speed, such film-forming conditions as the flow rate, the pressure or electric power may be properly selected. The film-forming temperature (substrate temperature) is basically not restricted. The temperature is preferably set to conform to the modifying step. Specifically, it is chosen in the range of not more than 500° C. and at least 150° C.

Specific examples are described below when the film-formation is carried out by the CVD method.

The starting gas for film formation in this invention is a silane compound represented by the general formula $Si_nH_{2n+2}$ (n is a natural number), such as monosilane, disilane, trisilane or tetrasilane, or silane fluoride, organosilane, or a hydrocarbon. A gas such as hydrogen, fluorine, chlorine, helium, argon, neon or nitrogen may be introduced together with the starting gas. When hydrogen is used, it is effective in an amount of 0.01 to 100% (volume ration based on the starting gas). Its amount is selected by considering the speed of film formation or the properties of the film such as the amount of hydrogen combined. In the case of using the chemical vapor deposition method, the film-forming conditions are not particularly limited except that as in the case of a physical film-forming method, the amount of bound hydrogen is decreased to below a specific amount. The film forming conditions are selected so that the amount of bound hydrogen in the semiconductor film in this invention is not more than 20 atomic percent, preferably not more than 10 atomic percent. If ordinary conditions are selected, a semiconductor film having not more than 20 atomic percent of hydrogen is obtained. If desired, if the temperature is elevated within the above range, the amount of hydrogen can be made smaller. If this amount exceeds 20 atomic percent, the exhibited effect is very low, and the object of this invention cannot be achieved.

Specific conditions for this purpose will be shown below. In the case of photo CVD, the starting gas is decomposed by using a low-pressure mercury lamp, or a deuterium lamp or a rare gas lamp yielding ultraviolet light having a wavelength of not more than 350 nm. The conditions for film formation include a gas flow rate of 1 to 100 sccm, a reaction pressure of 15 mtorr to atmospheric pressure, and a substrate temperature of 200° to 600° C.

When the thermal resistance of the substrate plate, the film-forming time that can be calculated from the speed of film formation and the plasma treating temperature are considered, the preferred temperature of the substrate is usually chosen from the range of 300° to 500° C.

The plasma CVD is carried out under the following specific conditions.

The method of discharge that can be effectively used may be, for example, high frequency discharge, direct-current discharge, microwave discharge, or ECR discharge. The flow rate of the starting gas is 1 to 900 sccm, the reaction pressure is 0.001 mtorr to atmospheric pressure, and the electric power is in the range of 1 mW/cm$^2$ to 10 W/cm$^2$. These film-forming conditions are sufficient for the process, but may be changed as required depending upon the speed of film formation and the method of discharging. The temperature of the substrate is 200° to 600° C., preferably 300° to 500° C. The temperature is preferably higher within this range.

In the present invention, the film so formed is then modified. The modifying step is a step of improving the properties of the semiconductor film by exposing the film to an atmosphere where a non-film-forming reactive gas is discharged, or to a monovalent ion, or to atomic hydrogen.

First, a step of introducing the non-film-forming reaction gas into a modifying chamber, discharging the reaction gas and subjecting the film to a discharge atmosphere of the reaction gas will be described.

The method of generating a discharge is, for example, high frequency discharge, direct-current discharge, microwave discharge or ECR discharge. The non-film-forming reactive gas is, for example, hydrogen, fluorine or a fluorine compound. Examples include hydrogen gas, hydrogen fluoride gas, fluorine gas, nitrogen trifluoride gas, or carbon tetrafluoride gas. Alternatively, mixtures of these gases may be used. Specific conditions in the modifying step are as follows: Discharging may be carried out at a discharging power of 1 to 500 W. The flow rate of the non-film-forming reactive gas is maintained at 5 to 500 sccm, and the pressure is maintained at 0.001 mtorr to atmosphere. The temperature of the substrate is controlled to be the same temperature as the substrate in the film-forming step, or a lower temperature. It is from room temperature to 600° C., preferably from 200° to 500° C.

The modifying step of exposing the film to a monovalent ion is as follows:

In this modifying step, the non-film-forming reactive gas is introduced into the modifying chamber to generate an electric discharge, and the semiconductor film is exposed to an electric discharge atmosphere. A bias voltage is applied to the substrate. The film formed on the substrate is effectively exposed to an ionized component. The monovalent ion, as used herein, may be a monovalent anion or cation such as hydrogen, fluorine or chlorine. To generate the discharge, high frequency discharge, direct current discharge, microwave discharge and ECR discharge may be effectively utilized. One useful method is to generate an ion effectively by an ion generating machine and conduct it to the surface of the substrate. Various ion-generating machines, such as a Kaufmann-type ion gun or an ECR ion gun, may be used. The non-film-forming reactive gas is hydrogen, fluorine or a fluorine compound, and, for example, hydrogen, hydrogen fluoride, fluorine, nitrogen trifluoride or carbon tetrafluoride may be effectively used. Mixtures of these gases may be used effectively.

Specific conditions for the modifying step are as follows: When discharging is used, the discharging power is maintained at 1 to 500 W. The flow rate of the non-film-forming reactive gas is maintained at 5 to 500 and the pressure of the reactive gas at 0.001 mtorr to atmospheric pressure. When an ion gun is used, the flow rate of the non-film-forming reactive gas is maintained at 1 to 50 sccm, and the pressure of the reactive gas, at 0.001 mtorr to 10 mtorr. A pressure range which generates the ions with a sufficient lifetime is used. The ion energy is 10 to 2000 eV, preferably 100 to 700 eV. If the ion energy is higher beyond this range, ionic damage and the sputtering phenomenon become vigorous, and the effect of improving the properties of the film is reduced. The temperature conditions during the modifying step are controlled by the temperature of the substrate. The temperature of the substrate is the same as the temperature of the substrate in the film-forming step or lower. It is from room temperature to 600° C., preferably 200° to 500° C.

The modifying step of exposing the film to atomic hydrogen is carried out as follows.

Atomic hydrogen is generated in a modifying chamber, or is generated in an atomic hydrogen generating chamber connected to a modifying chamber, and then introduced into the modifying chamber, whereby the film formed on the substrate is modified. To generate atomic hydrogen, it is possible to utilize high frequency discharge, direct-current discharge, microwave discharge, y ECR discharge, etc. Particularly, since by using microwave discharge or ECR discharge, atomic hydrogen can be generated in a high concentration, these methods are preferably used as means for generating atomic hydrogen. It is also possible to generate atomic hydrogen by means of hot filaments. In this case, by providing hot filaments near the surface of the film in the modifying chamber, atomic hydrogen can be fed effectively to the surface of the film. When a discharge is used, atomic hydrogen is generated and maintained at a discharge electric power of 1 to 500 W. at a flow rate of hydrogen or hydrogen diluted with an inert gas adjusted to 1 to 500 sccm under a pressure of 0.001 mtorr to atmospheric pressure. When hot filaments are used, atomic hydrogen can be easily generated by, for example, heating tungsten filaments at 1400° to 2000° C. A sufficient flow rate of hydrogen or hydrogen diluted with an inert gas is 1 to 500 torr. The temperature conditions in the 0.001 to 500 torr. The temperature conditions in the modifying step are controlled by the temperature of the substrate. The substrate temperature is equal to, or lower than, the substrate temperature in the film-forming step, and from room temperature to 600° C., preferably 200° to 500° C.

In the present invention, the film-forming step and the modifying step are repeated multiple times [more than once and no more than one hundred thousand times ($10^5$)]. By one film-forming step, the film can be formed to a thickness of 5 Å to 1000 Å, preferably 10 Å to 100 Å, especially preferably 10 Å to 80 Å, most preferably 30 Å to 50 Å. The entire thickness of the film which is not particularly limited, is preferably 1000 Å to 10 micrometers. The time required for 1 cycle is not particularly limited, but is within 1000 seconds. The time required to shift from the film-forming step to the modifying step and the time required to shift from the modifying step to the film-forming step is preferably as short as possible. This time depends upon the shape and size of the equipment, the evacuating system, etc. Specifically, it can be shortened to less than 30 seconds, and at times to less than 1 second.

The substrate on which the semiconductor films are formed is not essentially limited except that it can withstand the process temperature of the invention. Transparent materials such as soda lime glass, borosilicate glass or quartz glass, or metallic materials, ceramic materials and thermally stable polymeric materials may be used as the substrate. Of course, a substrate having an electrode formed therein as used in solar cells or sensors may effectively be used in this invention.

BRIEF DESCRIPTION OF THE ACCOMPANYING DRAWINGS

DETAILED DESCRIPTION

Figure 1:
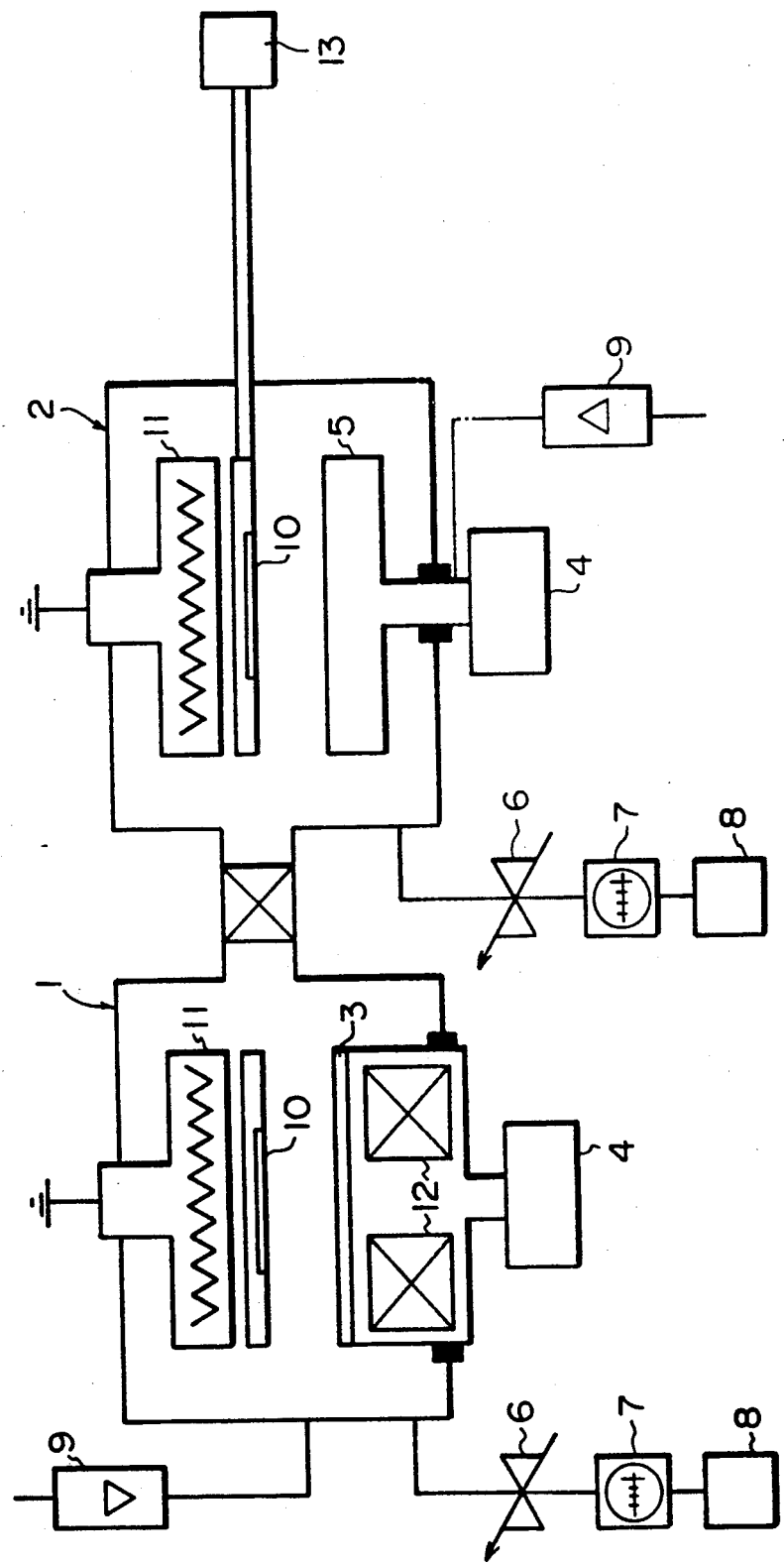
FIG. 1 is a schematic view showing one example of a film-producing device for practicing the present invention.

FIG. 1 is a perspective view showing one example of a device for producing a thin film of an amorphous semiconductor in accordance with the method of this invention. In FIG. 1, 1 represents a film-forming chamber (by sputtering); 2 represents a modifying chamber; 3 represents a Si target; 4 represents a high frequency electric supply; 5 represents a high frequency electrode; 6 represents a pressure control valve; 7 represents a turbo molecular pump; 8 represents a rotary pump; 9 represents a gas flow meter; 10 represents a substrate; 11 represents a substrate heater; 12 represents a magnet; and 13 represents a substrate conveying mechanism.

Figure 1A:
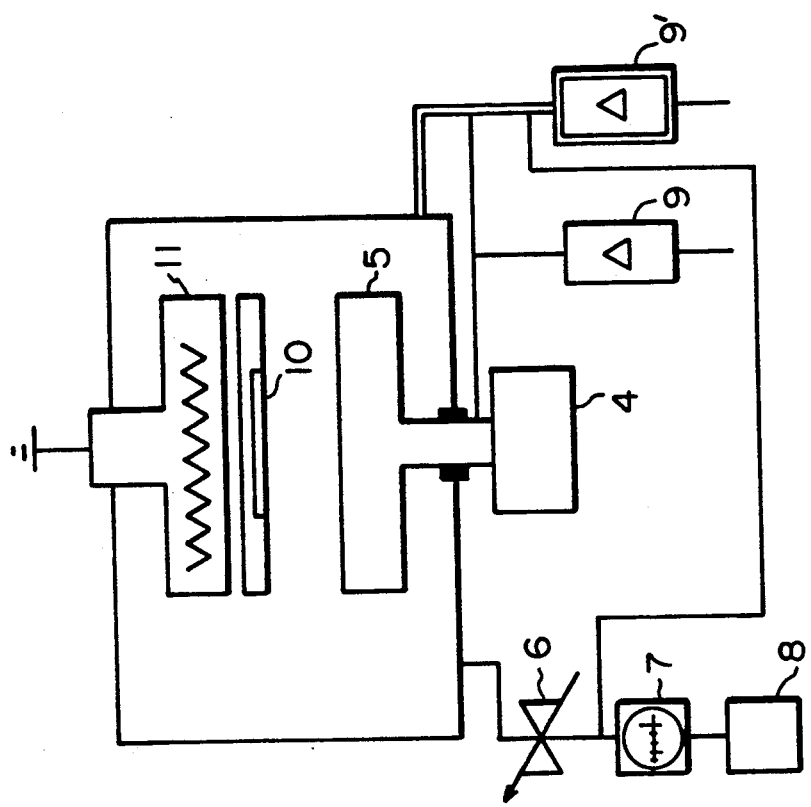
FIG. 1A is a schematic view showing another example of a film-producing device for practicing the present invention.

FIG. 1A is a schematic view of an apparatus in accordance with another embodiment for performing the method of this invention.

Figure 2:
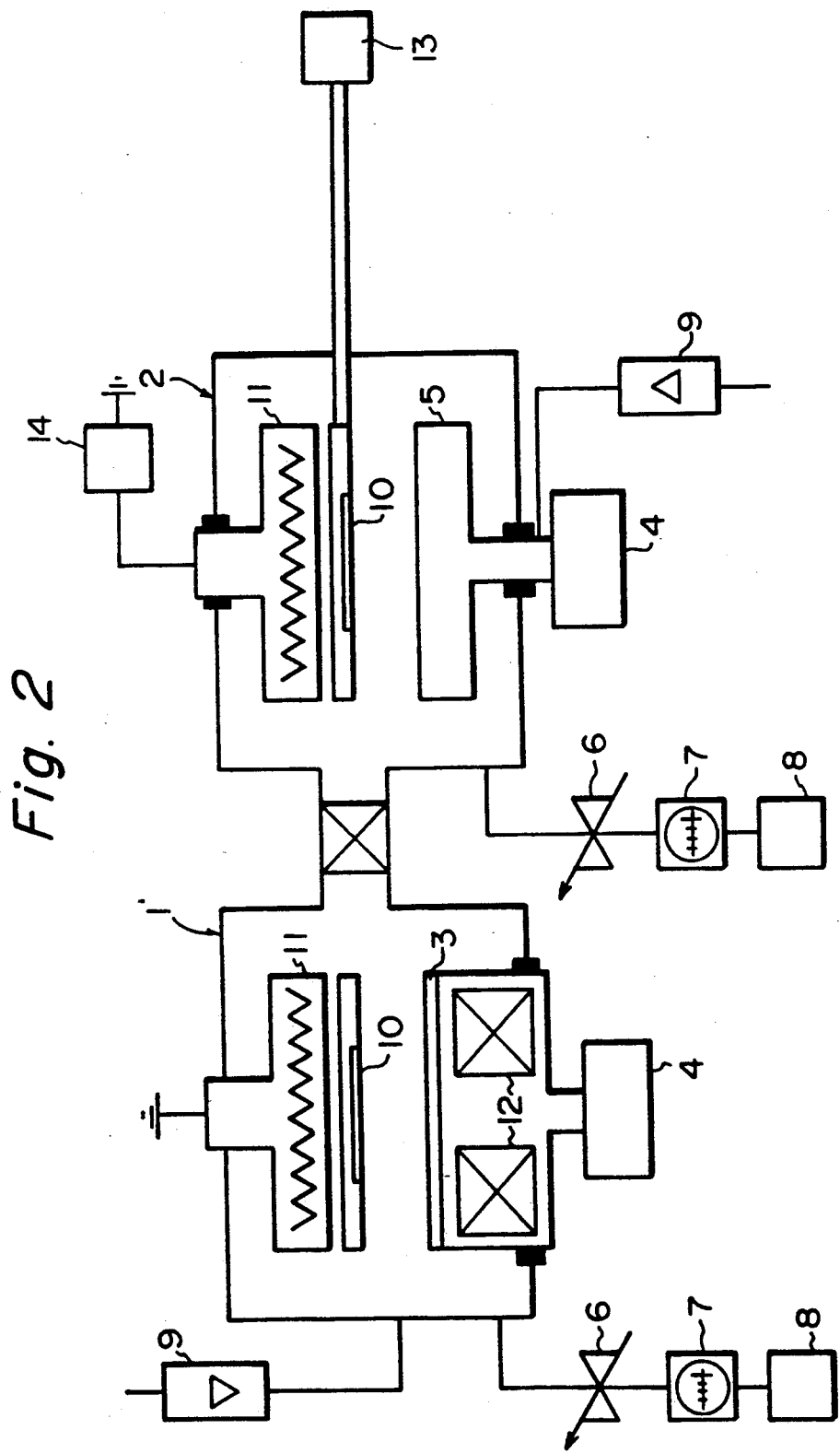
FIG. 2 is a schematic view showing another example of a film-producing device for practicing the present invention.
Figure 3:
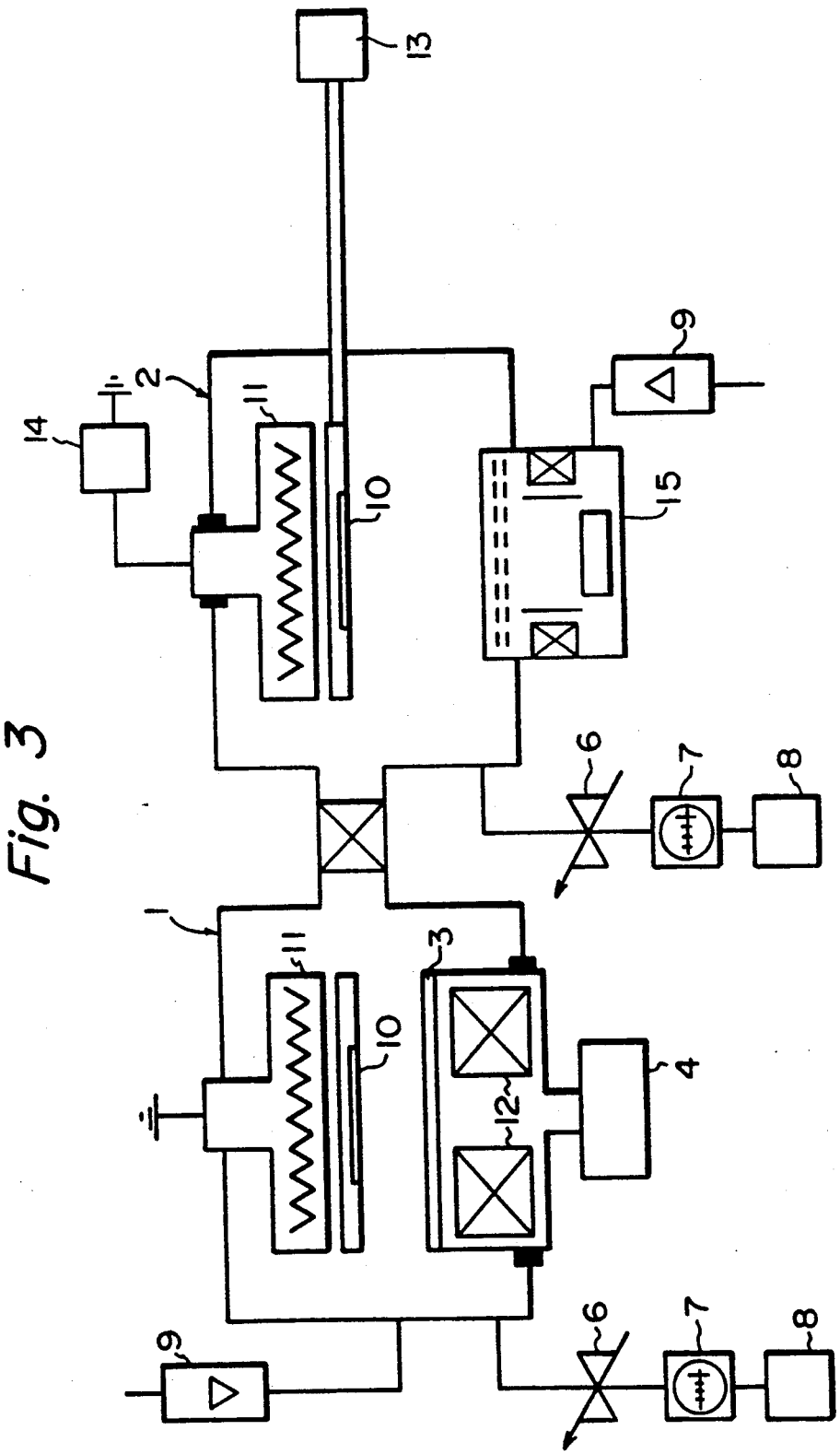
FIG. 3 is a schematic view showing another example of a film-producing device for practicing the present invention.

FIGS. 2 and 3 are schematic views showing examples of film-producing devices for practicing the present invention. In the drawings, 1 represents a film-forming chamber (by sputtering); 2 represents a modifying chamber; 3 represents a Si target; 4 represents a high frequency power supply; 5 represents a high frequency electrode; 8 represents a rotary pump; 9 represents a gas flow meter; 10 represents a substrate; 11 represents a substrate heater; 12 represents a magnet; 13 represents a substrate conveying mechanism; 14 represents a substrate bias power supply; and 15 represents an ion gun.

Figure 4:
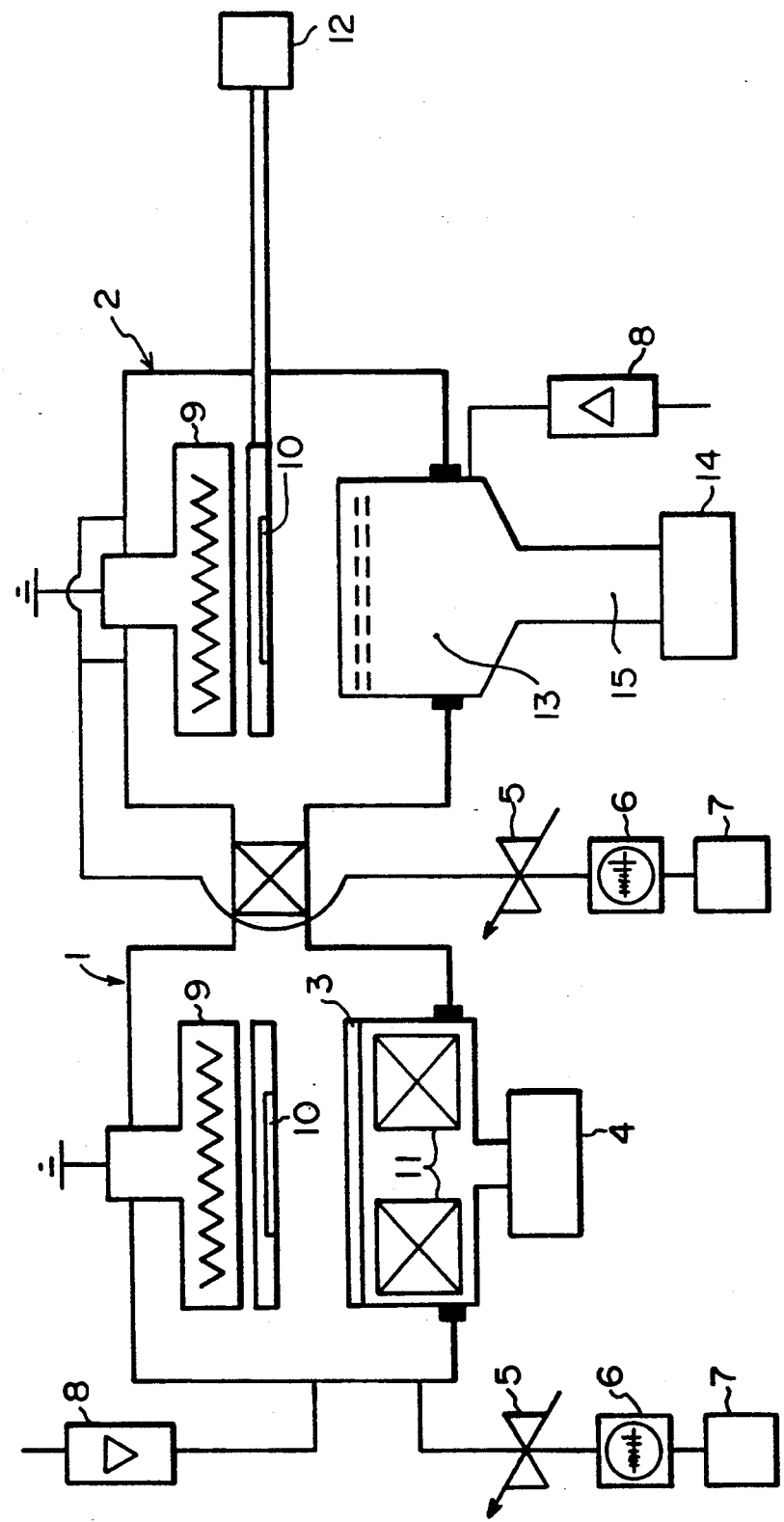
FIG. 4 is a schematic view showing another example of a film-producing device for practicing the present invention.
Figure 5:
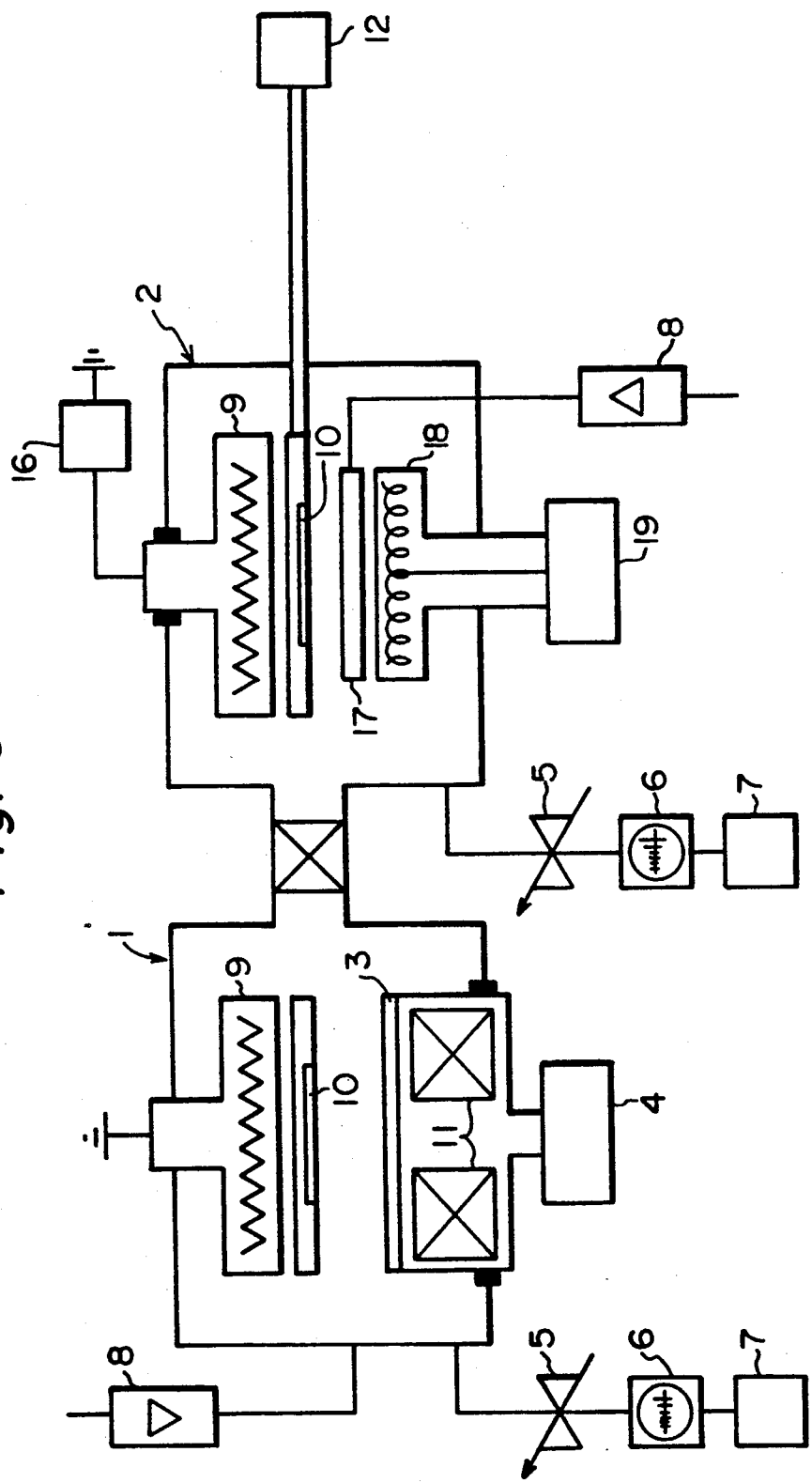
FIG. 5 is a schematic view showing another example of a film-producing device for practicing the present invention.

FIGS. 4 and 5 are schematic views showing examples of a film producing device for the practice of this invention. In the FIGS. 1 represents a film-forming chamber (by sputtering), 2 represents a modifying chamber; 3 represents a Si target; 4 represents a high frequency power supply; 6 represents a pressure control valve; 7 represents a turbo molecular pump; 8 represents a rotary pump; 9 represents a gas flow meter; 11 represents a substrate heater; 10 represents a substrate; 12 represents a magnet; 14 represents a substrate bias power supply; 19 represents a gas nozzle; 20 represents a hot electron generating device; and 21 represents a dc power supply.

Figure 6:
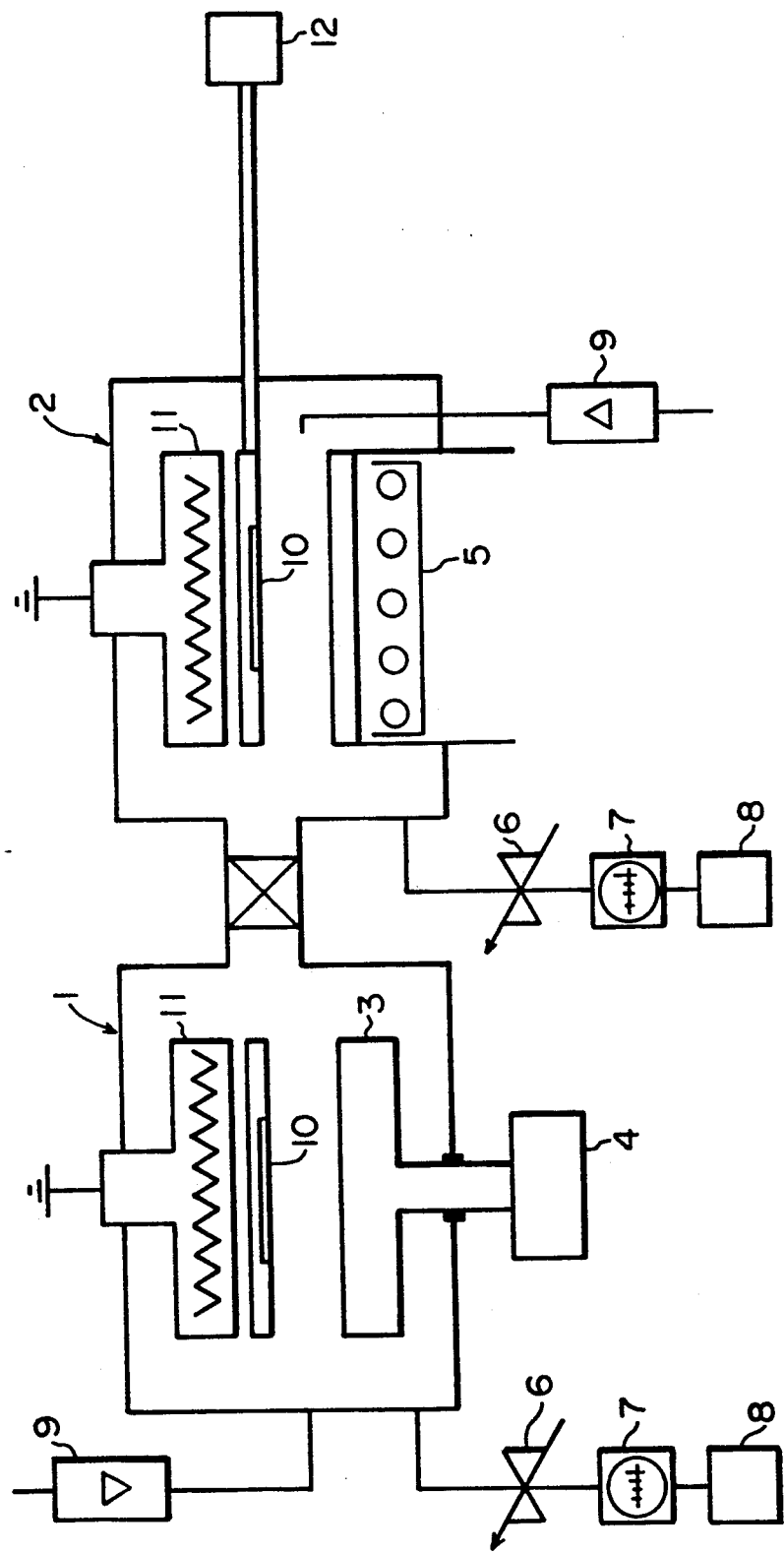
FIG. 6 is a schematic view showing another example of a film-producing device for practicing the present invention.
Figure 7:
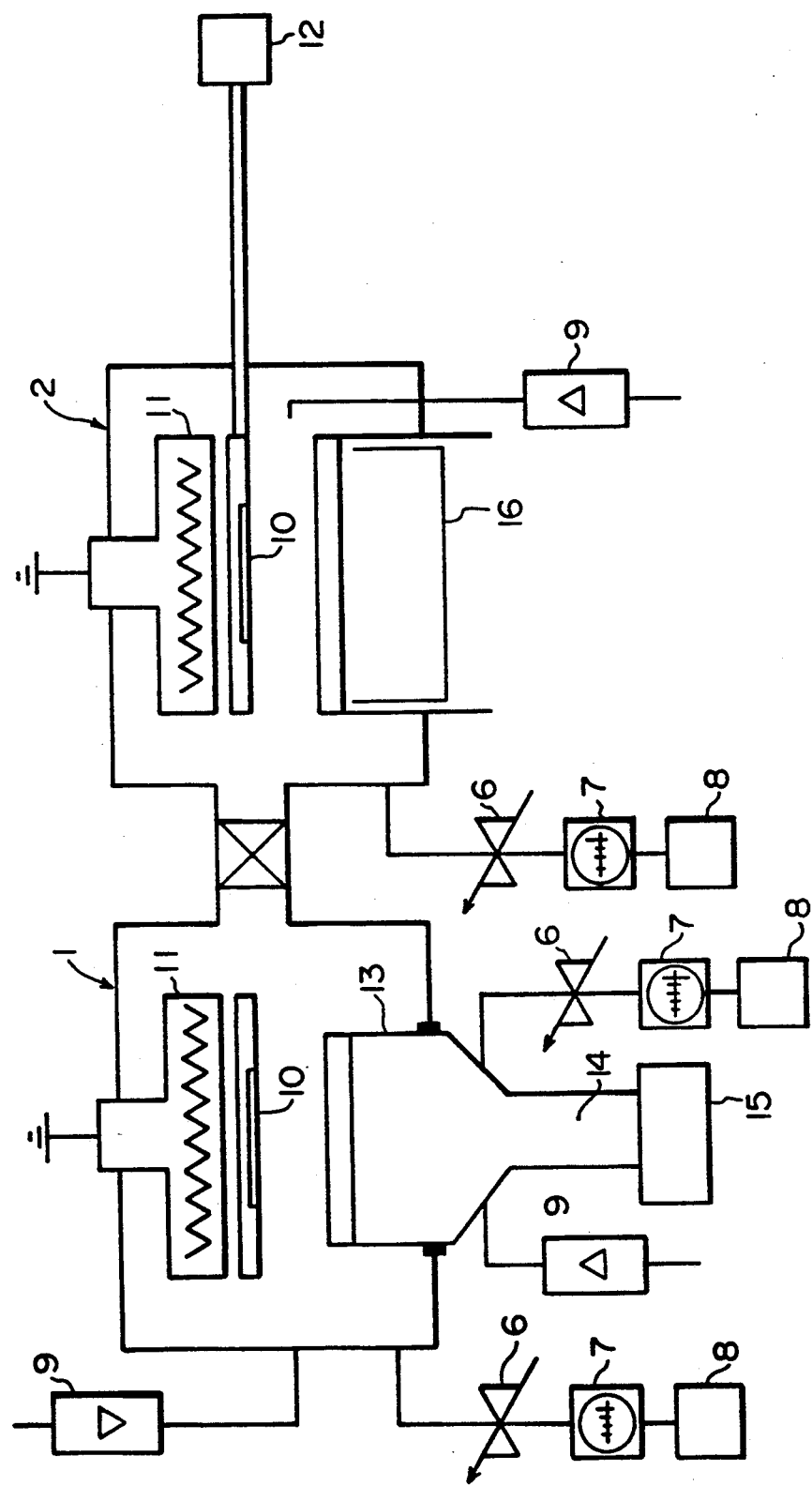
FIG. 7 is a schematic view showing another example of a film-producing device for practicing the present invention.

FIGS. 6 and 7 are schematic views showing examples of devices for forming a film in accordance with this invention. In the drawings, 1 represents a film-forming chamber; 2 represents a dehalogenating-hydrogenating chamber; 5 represents a high frequency electrode; 6 represents a pressure control valve; 7 represents a turbo-molecular pump; 8 represents a rotary pump; 9 represents a gas flow meter; 10 represents a substrate; 11 represents a substrate heater; 13 represents a substrate conveying mechanism; 22 represents an ultraviolet light generating device; 17 represents a wave guide tube; 18 represents a microwave power supply; and 23 represents a xenon flash lamp.

Figure 8:
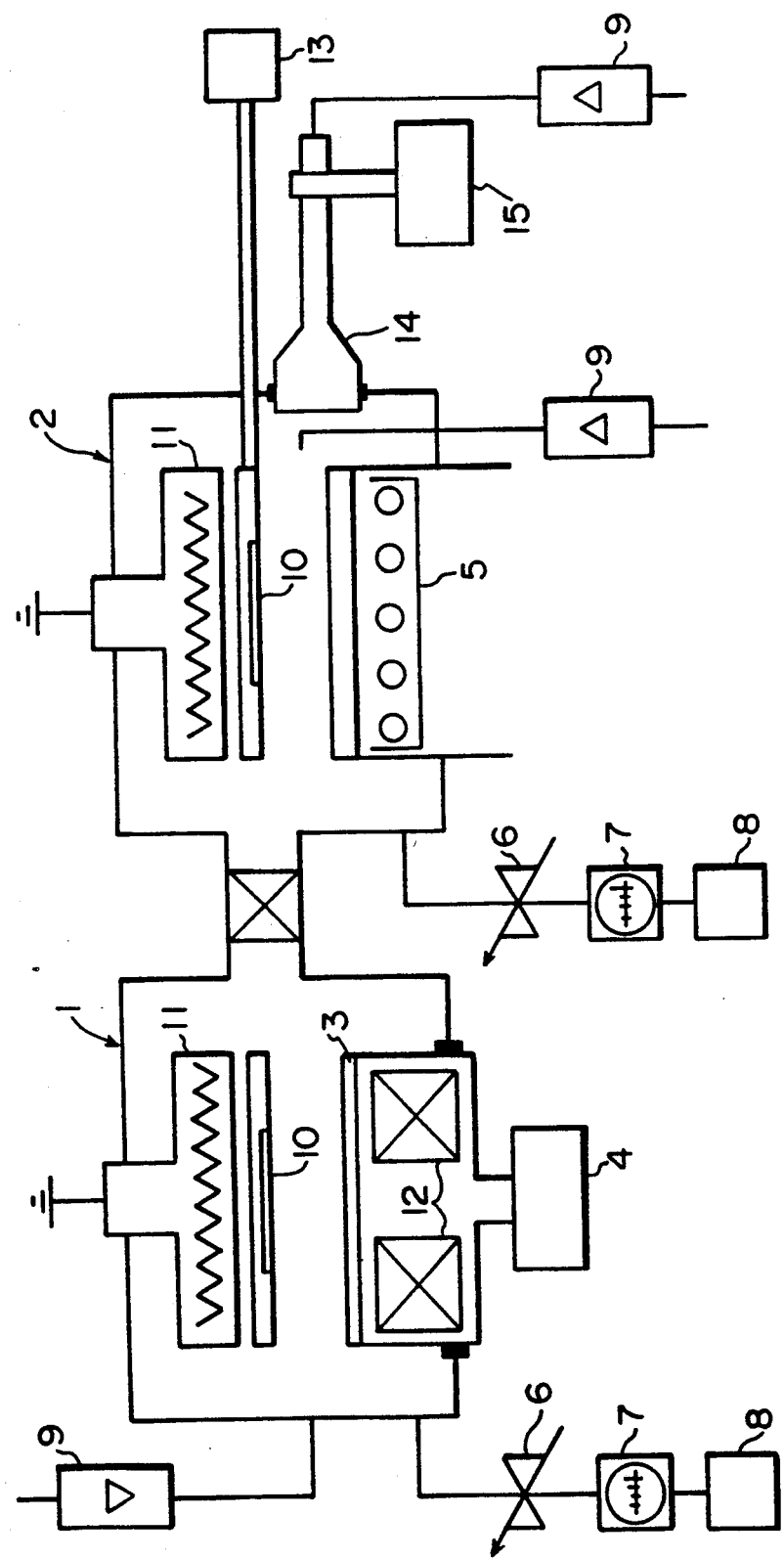
FIG. 8 is a schematic view showing another example of a film-producing device for practicing the present invention.
Figure 10:
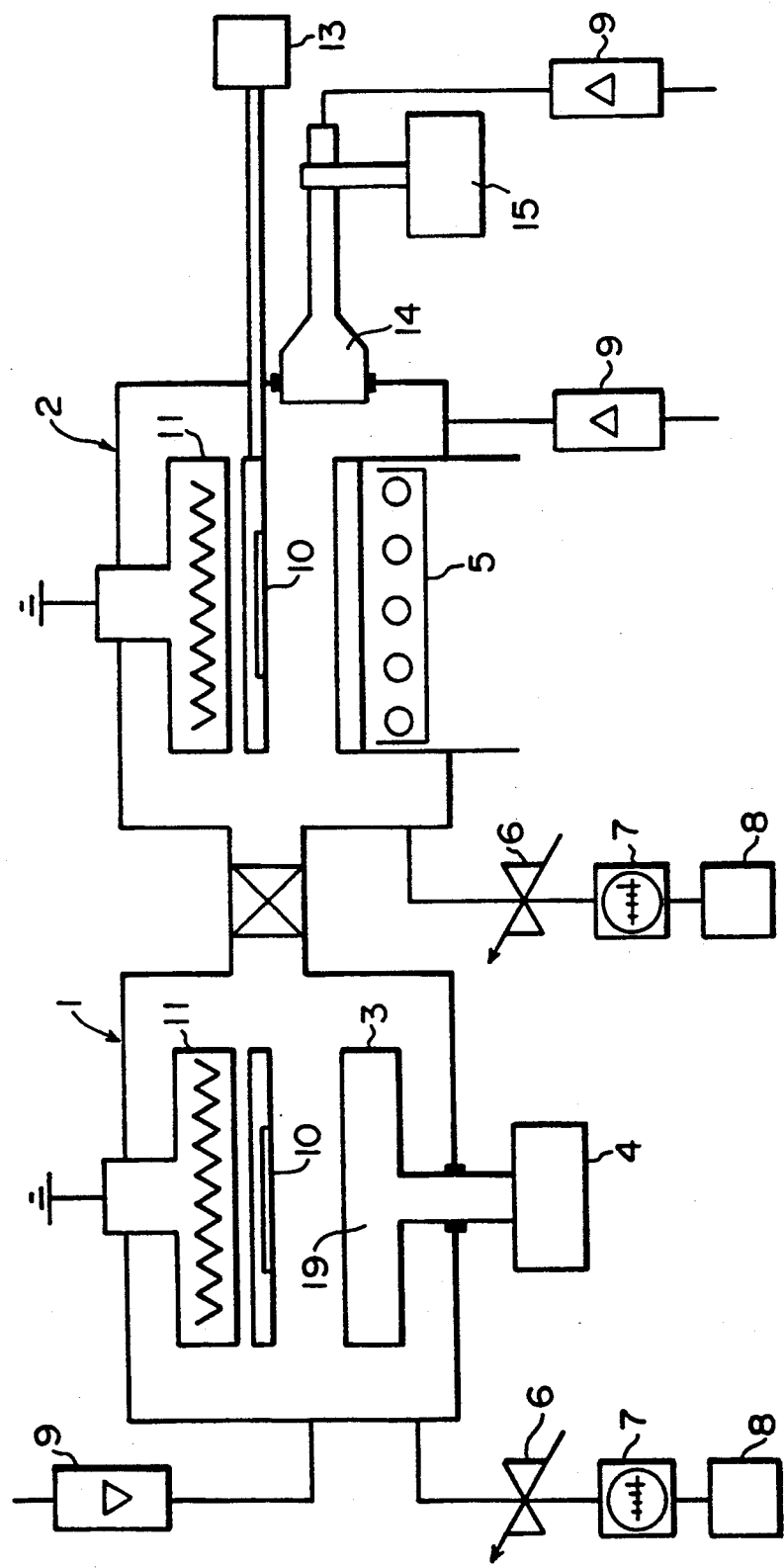
FIG. 10 is a schematic view showing another example of a film-producing device for practicing the present invention.

FIGS. 8 and 10 are schematic views showing examples of film-producing devices for practicing the present invention. In the drawings, 1 represents a film-forming chamber; 2 represents a dehalogenating-hydrogenating chamber; 3 represents a Si target; 4 represents a high frequency power supply; 22 represents a low pressure mercury lamp; 6 represents a pressure control valve; 7 represents a turbo-molecular pump; 8 represents a rotary pump; 9 represents a gas flow meter; 10 represents a substrate; 11 represents a substrate heater; 12 represents a magnet; 13 represents a substrate conveying mechanism; 24 represents a halogen atom generating device; 18 represents a microwave power supply; 25 represents a mercury reservoir; 22 represents a xenon flash lamp; 26 represents an ECR discharge mechanism; and 5 represents a high frequency electrode.

Figure 11:
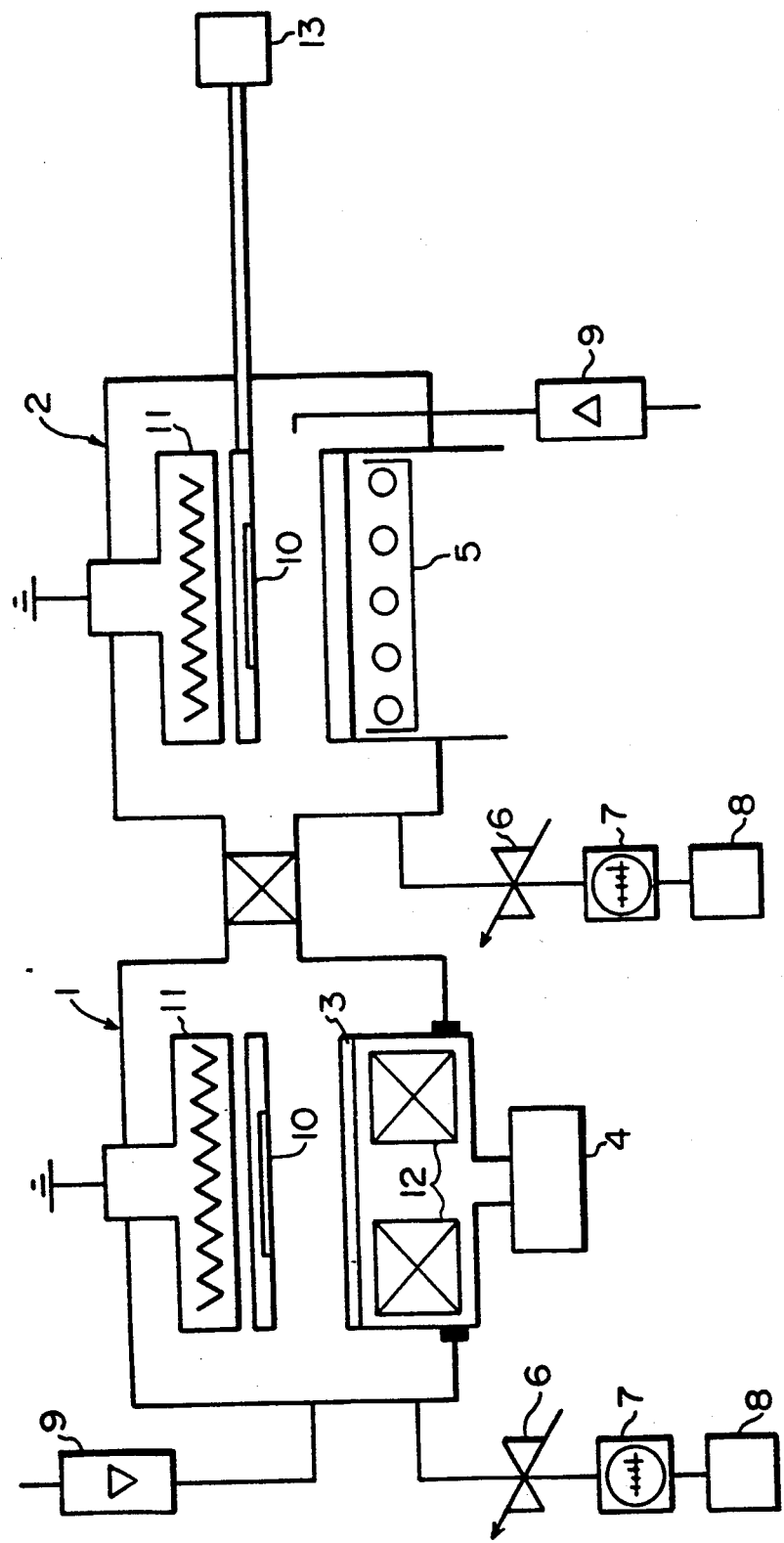
FIG. 11 is a schematic view showing another example of a film-producing device for practicing the present invention.
Figure 12:
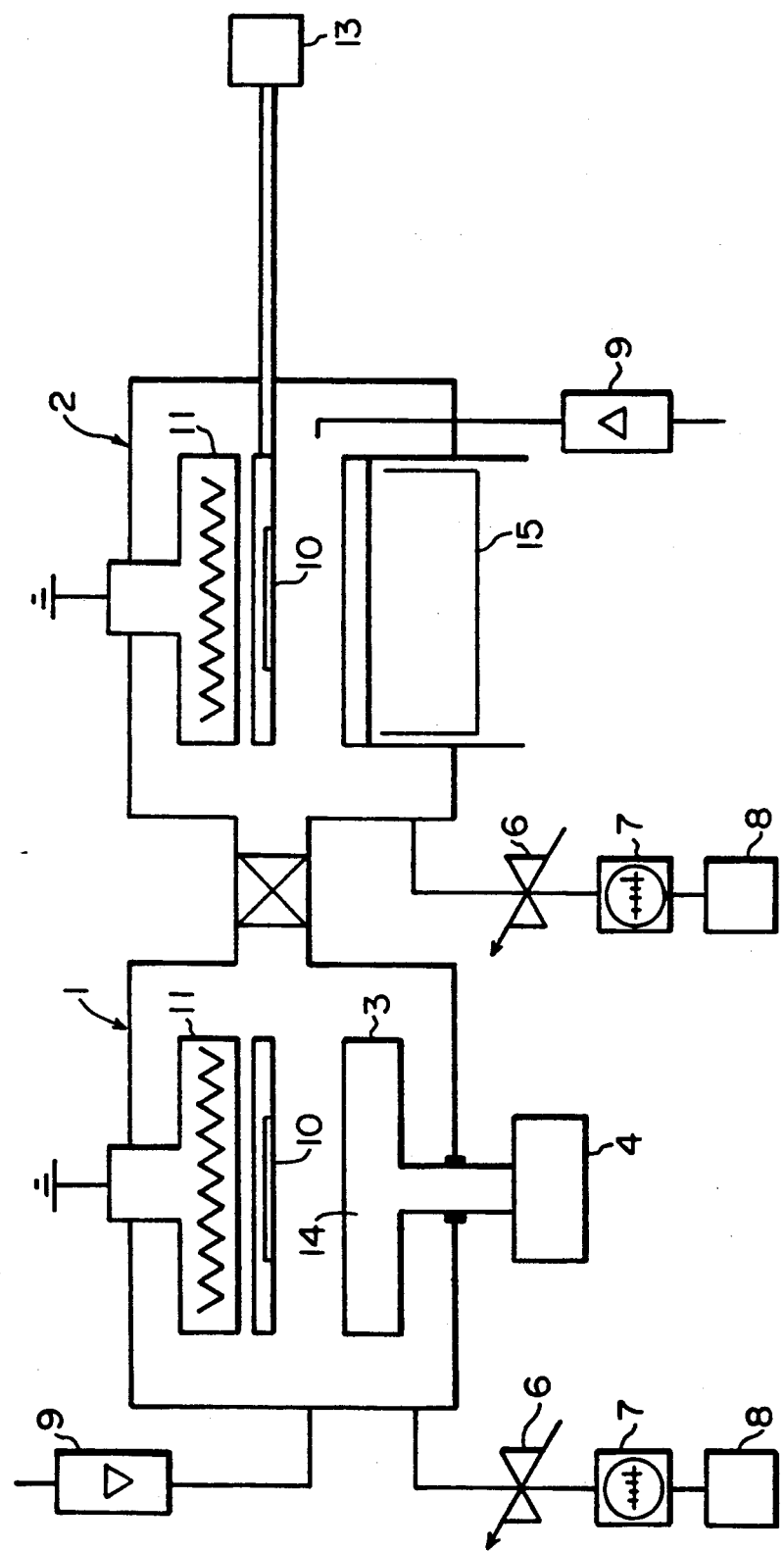
FIG. 12 is a schematic view showing another example of a film-producing device for practicing the present invention.

FIGS. 11 and 12 are schematic views showing examples of film-producing devices for practicing the present invention. In the drawings, 1 represents a film-forming chamber; 2 represents a dehalogenating-hydrogenating chamber; 3 represents a Si target; 4 represents a high frequency power supply; 22 represents an ultraviolet lamp; 6 represents a pressure control valve; 7 represents a turbo-molecular pump; a represents a rotary pump; 9 represents a gas flow meter; 10 represents a substrate; 11 represents a substrate heater; 12 represents a magnet; 13 represents a substrate conveying mechanism; and 23 represents a xenon flash lamp.

Figure 13:
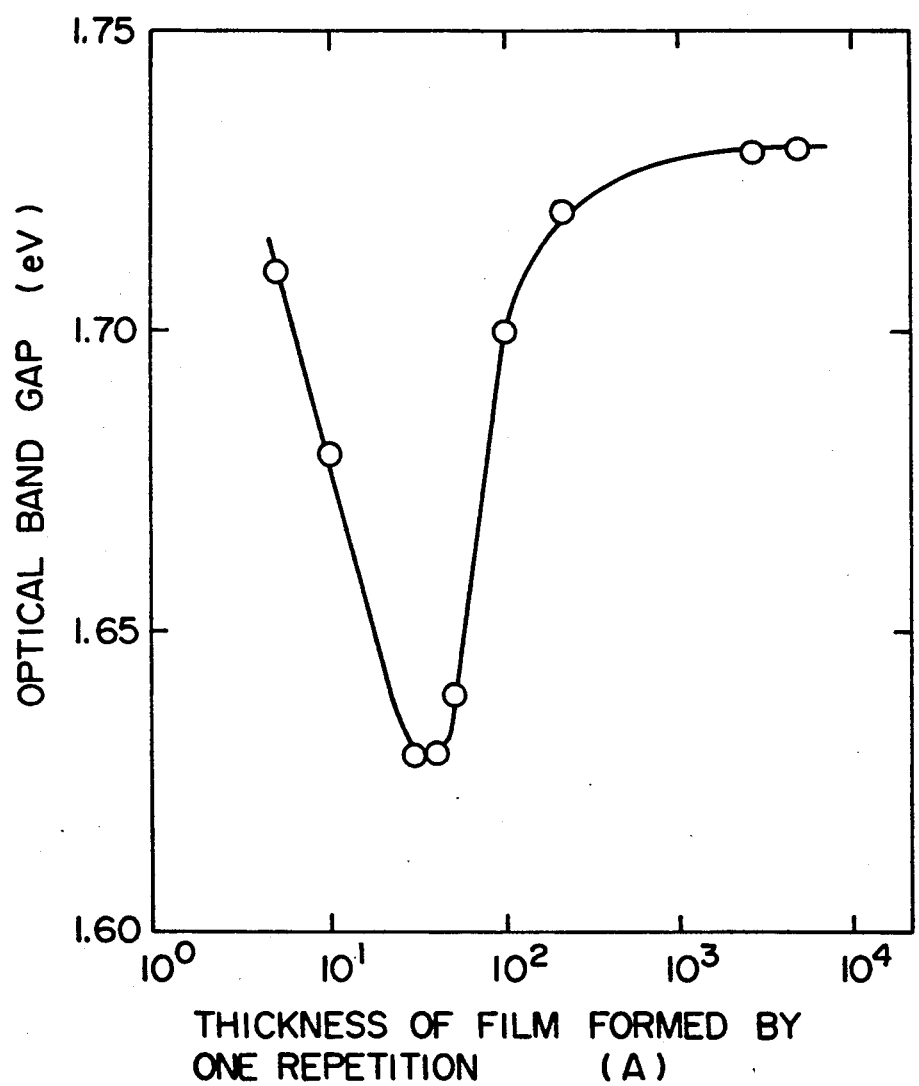
FIG. 13 is a graph of the optical band gap versus the thickness of film formed by one repetition.

FIG. 13 shows a graph of the optical band gap of a silicon film formed by repeating the film-forming step and a modifying step in relation to the film thickness formed by one repetition cycle of these steps.

Figure 14:
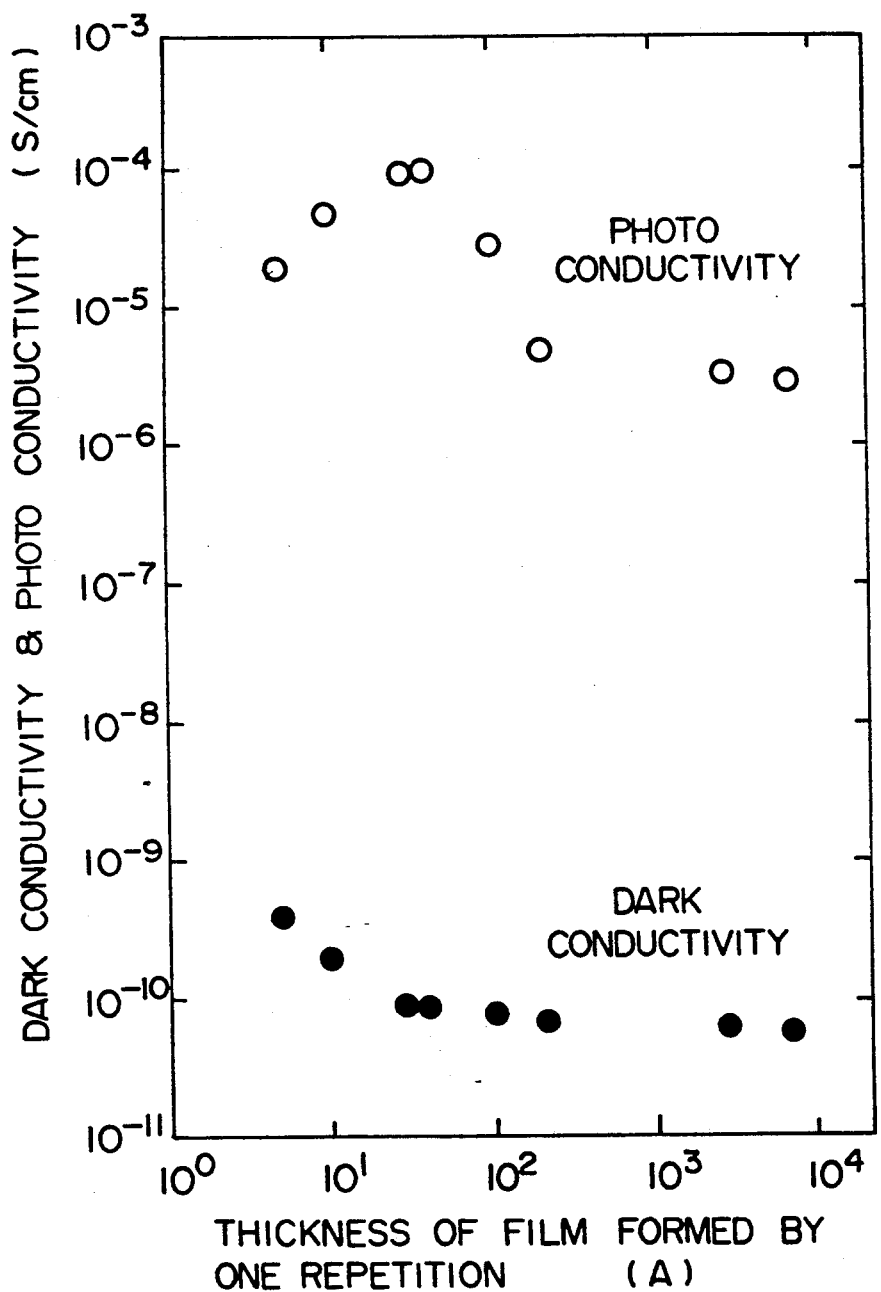
FIG. 14 is a graph of the dark conductivity and photoconductivity versus the thickness of a silicon film.

FIG. 14 shows the photo conductivity and dark conductivity of a silicon film formed by repeating the film-forming step and the modifying step shown in relation to the film thickness of a film formed by one repetition cycle.

Figure 15:
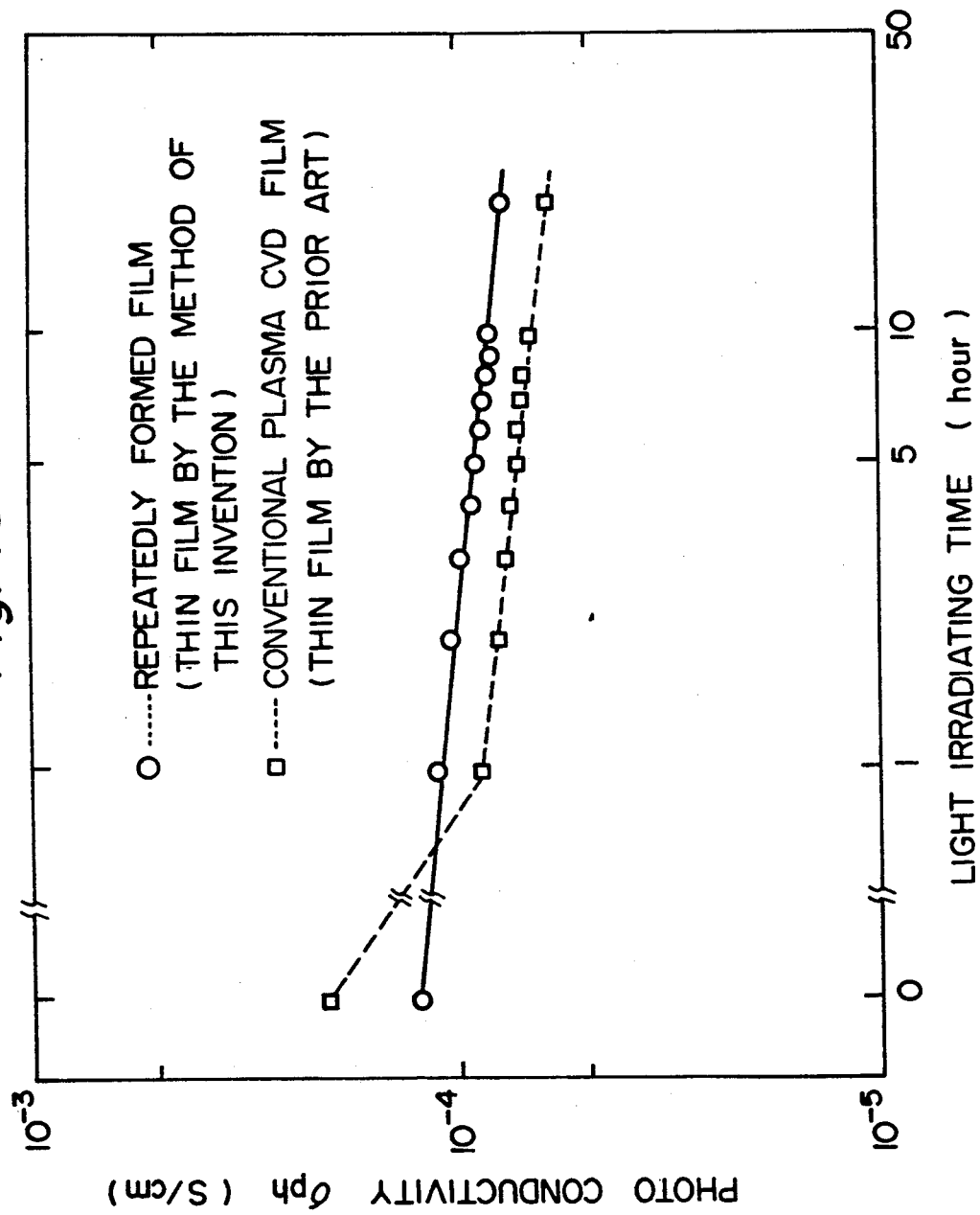
FIG. 15 is a graph of photoconductivity versus light irradiating time for two thin films.

FIG. 15 is a graph demonstrating the properties of the thin film of this invention.

EXAMPLES

One preferred example of an apparatus for performing the present invention is shown in FIG. 1. This apparatus is composed of a film-forming chamber 1 and a modifying chamber 2, each having a sputtering apparatus for deposition of silicon, and an electrode for generating a discharge for modifying or CVD. The two chambers are combined by a conveying device 13. The substrates 10 move continuously between, and thus, film formation and modifying can be repeated. The modifying step is carried out by exposing the thin film to a discharge atmosphere containing a non-film-forming reactive gas. Not only in the film-forming chamber 1, but also in the modifying chamber 2, a silicon film can be formed by plasma CVD. Namely, the modifying chamber may be used as a film-forming chamber (Example 4).

Of course, as shown in FIG. 1A, film-formation and modification can be carried out in a single chamber having a plurality of gas flow meters 9,9'. For example, by feeding hydrogen continuously from 9, and supplying disilane from 9' intermittently, film formation and modification can be carried out repeatedly.

The sputtering may be carried out by using a high-frequency magnetron sputterer.

EXAMPLE 1

An experiment was carried out by using the apparatus shown in FIG. 1. Sputtering was performed by a high-frequency magnetron sputtering method.

As a starting material, high-purity silicon was placed as a target on a cathode. The substrate temperature was set at 300° C. which was the temperature employed in the following modifying step. The pressure of the inside of the reaction chamber was maintained at 0.6 mtorr, and a high frequency electric power of 100 W was applied to form a thin Si film having a thickness of about 100 Å. The substrate on which the thin film was formed was transferred to the modifying chamber 2 within 60 seconds. As shown in Comparative Example 1, the amount of bound hydrogen in the Si film was determined to be less than 1 at %. In the modifying chamber, under conditions involving a hydrogen gas flow rate of 100 sccm and a pressure of 0.2 torr, a high-frequency power of 50 W was applied to generate a high-frequency discharge, and the thin Si film was exposed for 30 seconds to a discharge. The substrate which had been subjected to the modifying step was transferred back to the film-forming chamber 1, and the film-forming step and the modifying step were repeated under the same conditions. By repeating these steps forty times, a thin film having a thickness of about 4000 Å was obtained. As the substrate, a quartz glass substrate and a single crystal Si substrate were used. The optical properties of the thin Si film formed on the quartz substrate were measured, and by forming a metallic electrode on part of the Si film, its electrical properties were measured. The film formed on the single crystal Si substrate was subjected to infrared spectrum measurement for calculating the amount of combined hydrogen. The amount of bonded hydrogen was further confirmed by secondary ion mass spectrometry (SIMS).

The properties of the resulting Si film were as follows: optical band gap 1.65 eV; conductivity (photo conductivity) under irradiation of pseudo-solar light (AM-1.5) at an intensity of 100 mW/cm$^2$, $2 \times 10^{-4}$ S/cm; dark conductivity $7 \times 10^{-11}$ S/cm; activation energy 0.82 eV; and the amount of bound hydrogen 5 at %.

To examine the light stability of the Si film pseudo-solar light (AM-1.5) was continuously irradiated for 20 hours at an intensity of 100 mW/cm$^2$, and variations in photo conductivity were observed. The change in photo conductivity 20 hours later versus the initial photo conductivity was not more than 5%, and it was found that the film had very high stability.

EXAMPLE 2

In Example 1, the film thickness and the modifying time were changed respectively to about 3 Å and 6 seconds. The change of the film thickness was performed by changing the film-forming time. In Example 1, it was found that the film-forming speed by sputtering is about 1 Å/sec. In this example, the film-forming time for one repetition cycle was adjusted to 3 seconds. By repeating the film-forming step and the modifying step 1350 times, a thin film having a thickness of 4000 Å was obtained. By performing the same measurement as in Example 1, the following results were obtained. The optical band gap was 1.59 eV; the conductivity (photo conductivity) under a pseudo-solar light (AM-1.5) of 100 mW/cm$^2$, 3×10$^{-4}$ S/cm; dark conductivity 5×10$^{-11}$ S/cm; activation energy 0.80 eV; and the amount of bound hydrogen 3 at %.

To examine the light stability of the thin Si film, a pseudo-solar light (AM-1.5) was continuously irradiated at an intensity of 100 mW/cm$^2$ for 20 hours, and the changes in photo conductivity were observed. Changes in photo conductivity compared to the initial photo conductivity were not more than 5%. It was found that the film had very high stability.

In this example, the times of film formation and modifying, however, were at least about 30 times larger than in Example 1.

EXAMPLE 3

In Example 1, the film thickness and the modifying time were changed to about 500 Å, and 150 seconds, respectively. The film thickness was changed by changing the film forming time. In Example 1, it was found that the film-forming speed by sputtering was about 1 Å/sec. In this Example, the film-forming time was adjusted to 500 seconds. By repeating the film-forming step and the modifying step eight times, a thin film having a thickness of 4000 Å was obtained. The same measurement as in Example 1 was performed to obtain the following results. The optical band gap was 1.73 eV; the conductivity (photo conductivity) under irradiation of a pseudo-solar light (AM-1.5) at an intensity of 100 mW/cm$^2$, 5×10$^{-5}$ S/cm; dark conductivity 5×10$^{-10}$ S/cm; activation energy 0.87 eV; and the amount of bound hydrogen 8 at %.

To examine the light stability of the thin Si film, a pseudo-solar light (AM-1.5) was irradiated continuously at an intensity of 100 mW/cm$^2$ for 20 hours, and a change in photo conductivity was observed. A change in photo conductivity after 20 hours versus the initial photo conductivity was about 8%, and it was found that the stability of the thin film was very high.

COMPARATIVE EXAMPLE 1

In Example 1, after an Si thin film was formed, its thickness was increased to 4000 Å without performing a modifying step. The properties of the thin film obtained by this step were as follows: Photo conductivity 6×10$^{-7}$ S/cm; dark conductivity 6×10$^{-7}$ S/cm; and the amount of combined hydrogen not more than 1 at %. These film properties were very much lower than those shown in Example 1, and the resulting film did not show opto-electrical properties. It could not be used as an opto-electrical converting device. The present Comparative Example shows that unless the material formed in this example was subjected to a modifying step, the effect of this invention cannot be exhibited.

COMPARATIVE EXAMPLE 2

In Example 1, an Si film was formed to a thickness of 4000 Å (the amount of bonded hydrogen was not more than 1 at % or more). Then, the film was subjected to a modification step. The discharging time for modification was 1200 seconds. The thin film obtained by the present method had the following properties. Photo conductivity 2×10$^{-5}$ S/cm; dark conductivity 1×10$^{-9}$ S/cm; and the amount of bound hydrogen 11 at %. The film properties were lower than those shown in Example 1, and were the same as those of a thin Si film obtained by a conventional glow discharge method or a photo CVD method. When the light stability was measured, it was found that the change of photo conductivity after 20 hours was about 90%, i.e., the same degree as a conventional Si film. The present Comparative Example indicates the importance that the film thickness for one repetition cycle not be more than 1000 Å, and if the requirement for the film thickness is not met the repetition of film-forming and modifying steps is ineffective.

EXAMPLE 3'

Example 1 was repeated with the modification that the film-forming step was carried out by using reactive sputtering by adding hydrogen (A thin film having a film thickness of 4000 Å was formed, and its amount of bound hydrogen was measured and found to be 13 at %.).

The thin film obtained by this method had the following properties.
Photo conductivity: 5×10$^{-5}$ S/cm
Dark conductivity: 6×10$^{-10}$ S/cm
Amount of bound hydrogen: 12 at %.

These film properties were lower than those given in Example 1, and were the same as those of an Si film obtained by a conventional glow discharge method of photo CVD method. The stability of this film was measured, and the change of the photo conductivity after 20 hours was about 15% compared to the initial photo conductivity.

EXAMPLE 4

An experiment was conducted by using the apparatus shown in FIG. 1A. In this Example, a film was formed by using a gaseous mixture of disilane and hydrogen in a forming chamber by plasma CVD. The film-forming conditions were disilane 2 sccm, hydrogen 50 sccm, reaction pressure 0.25 torr, high frequency power 15 W; and substrate temperature 400° C. After a Si film was formed to a thickness of about 40 Å, the supply of disilane was stopped without stopping discharging. The Si film was exposed for 10 seconds to a discharge under conditions involving 50 sccm of hydrogen, a pressure of 0.25 torr, a high frequency power of 15 W and a substrate temperature of 400° C. After modification, the disilane was again introduced at a rate of 2 sccm, and the film-forming step/modification step cycle was repeated under the same conditions. After 180 repetitions, a thin film having a thickness of about 7000 Å was obtained. A quartz glass substrate and a single crystal Si substrate were used in this Example. By using a Si film formed on the quartz plate, optical properties were measured. A metallic electrode was formed on part of the quartz plate, and its electrical properties were measured. By subjecting the sample formed on the single crystalline Si substrate to infrared absorption spectral analysis, the amount of bound hydrogen was estimated. The amount of bound hydrogen was further confirmed by secondary ion mass spectrometory (SIMS).

The resulting thin Si film had the following properties: Optical band gap 1.63 eV; conductivity (photo conductivity) under irradiation of a pseudo-solar light (AM-1.5) at 100 mW/cm$^2$, 1×10$^{-4}$ S/cm; dark conductivity 9×10$^{-11}$ S/cm; activation energy 0.80 eV; and bound hydrogen 5 at %.

To examine the light stability of the thin Si film, pseudo-solar light (AM-1.5) was continuously irradiated at a rate of 100 mW/cm$^2$, and changes in light conductivity were observed. The change in photo conductivity after 20 hours compared to initial photo conductivity was not more than 5%. It was found that the thin film had very high stability.

EXAMPLE 5

In Example 5, the film thickness was changed to about 100 Å. The film thickness was changed by changing the film-forming time. By repeating the cycle of film-forming step/modifying step seventy times, a film having a thickness of about 7000 Å was obtained. The resulting film has the following properties. Optical band gap 1.70 eV; photo conductivity $3 \times 10^{-5}$ S/cm; dark conductivity $8 \times 10^{-11}$ S/cm and the amount of bound hydrogen 8 at %. The light stability of this film was measured. The change of the photo conductivity was about 15%. Although the light stability of the resulting film was slightly inferior to the film obtained in Example 1, it was better than a conventional Si film.

EXAMPLE 6

In Example 6, the film thickness was changed to about 10 Å. The film thickness was changed by changing the film-forming time. By repeating the film-forming step/modifying step 700 times, a film having a thickness of about 7000 Å was obtained. The resulting film had the following properties. Optical band gap 1.68 eV; photo conductivity $5 \times 10^{-5}$ S/cm; dark conductivity $2 \times 10^{-10}$ S/cm; and the amount of bound hydrogen 6 at %. When the light stability of this film was changed, the change of the photo conductivity was about 10% showing a great improvement over the conventional Si film.

COMPARATIVE EXAMPLE 3

After formation of the Si film as in Example 4, the film was grown to a thickness of 7000 Å without performing the modifying step. The resulting film had the following properties. Optical band gap 1.73 eV; photo conductivity $1 \times 10^{-4}$ S/cm; dark conductivity $6 \times 10^{-10}$ S/cm; and the amount of bound hydrogen 12 at %. The film properties were slightly lower than those shown in Example 4. When the light stability of the film was measured, the change in photo conductivity after 20 hours irradiation was 60%. Hence, it lacked reliability for use as a material for a solar cell.

The present Comparative Example shows that unless the modifying step is carried out, the effect of the present invention cannot be exhibited.

EXAMPLE 6'

In Example 6, only the film thickness was changed to about 200 Å. The change of the film thickness was carried out by changing the film-forming time. By repeating the cycle of film-forming step/modifying step 35 times, a film having a thickness of about 7000 Å was obtained. The film obtained by this method had the following properties. Optical band gap 1.72 eV; photo conductivity $5 \times 10^{-6}$ S/cm; dark conductivity $7 \times 10^{-11}$ S/cm; and the amount of bound hydrogen 10 at %. When the light stability of this film was measured, the change of the photo conductivity 20 hours later was about 30%.

This example suggests that the thin film formed by one repetition cycle has an optimum thickness value.

Thus, the relation between the thickness of the film formed by one repetition cycle to its optical band gap, and the relation between the photo conductivity and dark conductivity of the film were further considered in detail. The results are shown in FIGS. 13 and 14. It is found from FIG. 13 that when the thickness of the film formed by one repetition cycle is 5 Å to 100 Å, its optical band gap is not more than 1.70 eV, and especially when its film thickness is 30 Å to 50 Å, its optical band gap is narrower, i.e., 1.63 to 1.64 eV. FIG. 14, on the other hand, shows that when the repeatedly formed film has a thickness of 5 Å to 100 Å, the photo conductivity is $2 \times 10^{-5}$ S/cm or higher, and when the film thickness is 30 Å to 50 Å, the photo conductivity is even higher, i.e., $1 \times 10^{-4}$ S/cm.

Now, Examples 7 to 14 will be given in which the apparatus depicted in FIGS. 2 to 5 are employed.

In FIG. 2, the reference numeral 14 represents a substrate bias power supply. By this apparatus, a bias voltage can be applied to the substrate, and ionized components can be effectively exposed to the thin film on the substrate as monovalent ions. In FIG. 3, an ion generating device such as an ion gun 15 is used instead of the discharge to generate ions. FIG. 4 is an example of a apparatus for generating atomic hydrogen in generator 13 by using a microwave discharge 14. FIG. 5 shows an example of a device in which an electron generating device 18 such as a hot filament is used.

In these apparatuses, the substrate continuously moves from the film-forming chamber to the modifying chamber and back to repeat the film formation and modification.

EXAMPLE 7

An experiment was carried out using the apparatus shown in FIG. 2. Sputtering was carried out using a high-frequency magnetron sputtering method. As a starting material, a high-purity silicon target 3 was placed on the cathode, and argon gas (10 sccm) was introduced. The substrate temperature was set at 300° C. which was also the temperature in the following modifying step. A film-forming chamber kept at a pressure of 0.6 m torr, a high frequency power of 100 W was applied to form a Si thin film having a thickness of about 100 Å on the substrate. After film formation, the substrate was transferred to the modifying chamber within 60 seconds. The amount of bound hydrogen in the Si film was not more than 1 at %. In the modifying chamber, a bias voltage of −100 V was applied to the substrate. A high frequency power of 50 W was applied by flowing hydrogen gas at 100 sccm under a pressure of 0.2 torr. Thus, a high frequency discharge was generated, and the Si film was exposed to the discharge for 30 seconds. The excited hydrogen gas contained hydrogen atoms and excited ionized molecules. By biasing, these ionic components were attracted to the substrate. Again, the substrate which had received the modifying step was transferred to the film-forming chamber, and the cycle of film-forming step/modifying step was repeated under the same conditions. A thin film having a thickness of about 4000 Å was obtained by repeating the above steps 40 times. A quartz glass substrate and a single crystal Si substrate were used. The optical properties of the Si film formed on the quartz substrate were measured. A metal electrode was formed on part of it, and its electrical properties were measured. The film formed on the single crystal Si substrate was used as a sample for calculating the amount of bound hydrogen. This amount of bound hydrogen was confirmed by secondary ion mass spectrometry (SIMS).

The resulting Si film had the following properties: Optical band gap 1.66 eV; under an irradiation of a pseudo-solar light (AM-1.5) at an intensity of 100 mW/cm², conductivity (photo conductivity) $3 \times 10^{-4}$ S/cm; dark conductivity $6 \times 10^{-11}$ S/cm; activation energy 0.83 eV; and the amount of bound hydrogen 5 at %.

To examine the light stability of this Si film, a pseudo-solar light (AM-1.5) was continuously irradiated at an intensity of 100 mW/cm$^2$ for 20 hours, and the change in photo conductivity was observed. The change in photo conductivity 20 hours later versus the initial photo conductivity was about 7%. Thus, it was found that the film had very high stability.

EXAMPLE 8

In Example 8, the film thickness and the modifying time were changed to about 3 Å and 6 seconds. The change of the film thickness was carried out by changing the film-forming time. Since it was found that in Example 7, the film-forming speed of sputtering was about 1 Å/second, in the present Example, the film-forming time in one cycle was adjusted to 30 seconds. By repeating the cycle of film-forming step/modifying step 1350 times, a film having a thickness of about 4000 Å was obtained. By the same measurement as in Example 7, the following results were obtained. Optical band gap 1.60 eV; under an irradiation of a pseudo-solar light (AM-1.5) at an intensity of 100 mW/cm$^2$, conductivity (photo conductivity) $4 \times 10^{-4}$ S/cm; dark conductivity $4 \times 10^{11}$ S/cm; activation energy 0.81 eV; and the amount of bound hydrogen 3 at %.

To examine the light stability of the Si film, a pseudo-solar light (AM-1.5) was continuously irradiated at an intensity of 100 mW/cm$^2$ for 20 hours, and the change in photo conductivity was observed. The change in photo conductivity 20 hours later was not more than 5% versus the initial photo conductivity. Thus, it was found that the film had very high stability.

In this Example, the number of cycles of film formation/modification were more than 30 times that in Example 7, but these operations were very effective.

EXAMPLE 9

In Example 9, the film thickness and the modifying time were respectively changed to about 500 Å and 150 seconds. The film thickness was changed by changing the film-forming time. Since in Example 7, it was found that the film-forming speed by sputtering was about 1 Å/sec., in the present invention, the film-forming time was adjusted to 500 seconds for each cycle. By repeating the cycle of film-forming step/modifying step eight times, a film having a thickness of about 4000 Å was obtained. By the same measurement as in Example 7, the following results were obtained. Optical band gap 1.75 eV; under an irradiation of a pseudo-solar light (AM-1.5) at an intensity of 100 mW/cm$^2$, conductivity (photo conductivity) $6 \times 10^{-5}$ S/cm; dark conductivity $3 \times 10^{-10}$ S/cm; activation energy 0.88 eV; and the amount of bound hydrogen 10 at %.

Further, to examine the light stability of the Si film, a pseudo-solar light (AM-1.5) was irradiated for 20 hours at an intensity of 100 mW/cm$^2$, and the change in photo conductivity was observed. The change in photo conductivity 20 hours later versus the initial photo conductivity was about 7%. The film was found to have very high stability.

EXAMPLE 10

In Example 10, an ion gun was used instead of employing discharging, as shown in FIG. 3. At a pressure of 0.8 mtorr in the modifying chamber, ions were impinged at an ion energy of 500 eV to treat the surface of the Si film for 30 seconds.

The film obtained by this method had the following properties: Under an irradiation of a pseudo-solar light (AM-1.5) at an intensity of 100 mW/cm, conductivity (photo conductivity) $3 \times 10^{-4}$ S/cm; dark conductivity $5 \times 10^{-11}$ S/cm; optical band gap 1.65 eV; activation energy 0.83 eV; and the amount of bound hydrogen 4 at %. To examine the light stability of the Si film, a pseudo-solar light (AM-1.5) was continuously irradiated at an intensity of 100 mW/cm$^2$ for 20 hours, and the change in photo conductivity was observed. The change in photo conductivity 20 hours later versus the initial photo conductivity was not more than 5%. It was found that the film had very high stability.

EXAMPLE 11

An experiment was conducted using the apparatus shown in FIG. 4. The sputtering was performed by using a high frequency magnetron sputtering.

As a starting material, a high purity silicon target was placed on the cathode, and argon gas (10 sccm) was introduced. The temperature of the substrate was adjusted to 300° C., which also was the temperature of the following modifying step. At a pressure of 0.6 mtorr in a reaction chamber, a high frequency power of 100 W was applied to form a Si film having a thickness of about 100 Å. The substrate having this Si film formed thereon was transferred to the modifying chamber within 60 seconds after the film formation. The amount of bound hydrogen in the Si film was, as shown in Comparative Example 1, determined to be not more than 1 at %. In the discharge generating chamber, by passing 10 sccm of hydrogen gas under a pressure of 0.1 torr, a high frequency power of 100 W was applied to generate a microwave discharge. At a pressure of 0.01 torr in the modifying chamber, a gas stream containing atomic hydrogen was introduced into the modifying chamber to expose the Si film for 30 seconds to the gas stream. The substrate which had undergone the modifying step was transferred back to the film-forming chamber, and the cycle of film-forming step/modifying steps were repeated under the same conditions. By repeating these steps forty times, a film having a thickness of about 4000 Å was obtained.

A quartz glass substrate and a single crystal Si substrate were used in this Example. The optical properties of the Si film formed on the quartz substrate were measured. A metallic electrode was formed on part of it and its electrical properties were measured. A film formed on the single crystal Si substrate was used as a sample for calculating the amount of bound hydrogen by infrared absorption spectroscopy. The amount of bound hydrogen was confirmed by secondary ion mass spectrometry (SIMS).

To examine the light stability of the Si film, a pseudo-solar light (AM-1.5) was continuously irradiated for 20 hours, and the change in photo conductivity was observed. The change in photo conductivity 20 hours later versus the initial photo conductivity was about 7%. It was found that the film had very high stability.

The film obtained by this method had the following properties: Under an irradiation of a pseudo-solar light (AM-1.5) at an intensity of 100 mW/cm$^2$, photo conductivity $1 \times 10^{-11}$ S/cm; dark conductivity $8 \times 10^{-11}$ S/m; optical bond gap 1.65 eV; activation energy 0.83 eV; and amount of bound hydrogen 5 at %.

EXAMPLE 12

In Example 12, the film-forming thickness and the modifying time were changed to about 3 Å and 6 seconds. The film thickness was changed by changing the film-forming time. Since in Example 11 it was found that the film-forming speed during sputtering was about 1 Å/sec., the film-forming time for one cycle was adjusted to above about 3 seconds in this example. By repeating the cycle of the film-forming step and the modifying step 1350 times, a film having a thickness of 4000 Å was obtained. The film was measured as in Example 11, and the following results were obtained. Optical band gap 1.60 eV, under irradiation of a pseudo-solar light (AM-1.5) at an intensity of 100 mW/cm$^2$, conductivity (photo conductivity) $3 \times 10^{-4}$ S/cm; dark conductivity $4 \times 10^{-11}$ S/cm; activation energy 0.81 eV; and the amount of bound hydrogen 3 at %.

To examine the light stability of the Si film, a pseudo-solar light (AM-1.5) was continuously irradiated for 20 hours, and the change in photo conductivity was observed. The change in photo conductivity 20 hours later versus the initial photo conductivity was about 5%. It was found that the film had very high stability.

Although the number of repetition cycles of the film-formation and modifying was more than that described in Example 11, the procedure of the present Example was very effective.

EXAMPLE 13

In Example 13, the film-forming thickness and the modifying time were changed to about 500 Å and 150 seconds. The film thickness was changed by changing the film-forming time. Since in Example 11 it was found that the film-forming speed during sputtering was about 1 Å/sec., the film-forming time for one cycle was adjusted to 500 seconds in this Example. By repeating the cycle of film-forming step and the modifying step 8 times, a film having a thickness of 4000 Å was obtained. The film was measured as in Example 11, and the following results were obtained. Optical band gap 1.76 eV, under an irradiation of a pseudo-solar light (AM-1.5) at an intensity of 100 mW/cm$^2$, conductivity (photo conductivity) $4 \times 10^{-5}$ S/cm; dark conductivity $5 \times 10^{-10}$ S/cm; activation energy 0.88 eV; and the amount of bound hydrogen 10 at %.

To examine the light stability of the Si film, a pseudo-solar light (AM-1.5) was continuously irradiated for 20 hours, and the change in photo conductivity was observed. The change in photo conductivity 20 hours later versus the initial photo conductivity was about 8%. It was found that the film had very high stability.

EXAMPLE 14

An experiment was conducted using the apparatus shown in FIG. 5. Instead of generating a discharge, a modifying chamber 2 provided with tungsten filaments 20 was used. In a hydrogen atmosphere, the pressure of the modifying chamber was 0.1 torr, and the filament 20 had a temperature of 1800° C. As in Example 11, the modifying time was adjusted to 30 seconds.

The film obtained by this method had the following properties. Under an irradiation of a pseudo-solar light (AM-1.5) at an intensity of 100 mW/cm$^2$, conductivity (photo conductivity) $1 \times 10^{-4}$ S/cm; dark conductivity $1 \times 10^{-10}$ S/cm; optical band gap 1.65 eV; activation energy 0.83 eV; and the amount of bound hydrogen 5 at %.

To examine the light stability of the Si film, a pseudo-solar light (AM-1.5) was continuously irradiated for 20 hours at an intensity of 100 mW/cm$^2$, and the change in photo conductivity was observed. The change in conductivity after 20 hours versus the initial photo conductivity was about 7%. It was found that the film had very high stability.

It is seen from the foregoing Examples and Comparative Examples that the amorphous semiconductor film prepared by the method in which during every repetition cycle in accordance with this invention, a film having a thickness of 5 to 1000 Å, preferably 10 to 100 Å, was formed, as compared with the amorphous semiconductor film prepared without carrying out the modifying step, had a narrower optical band gap, had good opto-electrical characteristics, and good stability to light irradiation. In particular, an amorphous semiconductor film prepared wherein during every repetition cycle, a film having a thickness of 30 Å to 50 Å is prepared had a very narrow optical band gap, and showed very good opto-electrical properties and stability to light irradiation. This is associated with a great improvement in the opto-electrical converting efficiency of the amorphous solar cell, and to a great increase in reliability. The present invention can provide a technique which enables a solar cell to have a high converting efficiency and high reliability, and is a very useful invention to the energy industry.

The thin film of this invention has a deterioration ratio ($\sigma$ph/$\sigma$pho) expressed as percent of not more than 15% in 1 hour, and not more than 30% within 20 hours. The best conventional film of this type has a good deterioration ratio of about 50% or 60%. One example is shown in FIG. 15. By calculation on the basis of the data plotted in FIG. 15, the deterioration ratio was 11% after 1 hour, and 20% after 20 hours. In contrast, the films obtained in Comparative Examples had a deterioration ratio of 56 and 70%.

The semiconductor film obtained by the method of this invention contained about 1 to 10% by weight of bound hydrogen. c The film had a hole mobility of 0.01 to 1 cm$^2$/V.sec, showing a marked contrast with ordinary films which had a hole mobility of 0.001 to 0.006 cm$^2$/V.sec.

According to another embodiment of the invention, a silicon semiconductor film can be modified by dehalogenation-hydrogenation.

In this case, the silicon semiconductor film is a halogenated silicon semiconductor film, and the dehalogenation-hydrogenation can be carried out by contacting the halogenated silicon semiconductor film with a silane gas. On the other hand, if the silicon semiconductor film is a hydrogenated silicon semiconductor film, the dehalogenation-hydrogenation may be carried out by irradiating light onto the semiconductor film in an atmosphere of a silane gas. First, a method involving using a silane gas will be described.

The halogenated silicon semiconductor film may be formed, specifically by a physical film-forming method such as vacuum vapor deposition, sputtering or ion plating or by a chemical vapor phase film-forming (CVD) method such as photo CVD and plasma CVD. The dehalogenation-hydrogenation step is a step whereby silane is introduced into a film-forming surface-which is coated with halogen atoms, and heat, light or ionization is applied to induce dehalogenation-hydrogenation and silicon atoms are bonded to the film.

The halogenated semiconductor film of the invention may contain hydrogen.

In the present invention, it is essential to repeat the film-forming step and the dehalogenation-hydrogenation step. Preferably, the thickness of the semiconductor film formed by every repetition cycle of these steps is limited to not more than 100 Å but is at least 1 Å. Other film-forming conditions do not particularly impair the effect of the invention.

An effective physical film-forming method will be described below.

In the physical film forming method, an element, compound or alloy, for example, silicon, silicon carbide, silicon nitride, a silicon-germanium alloy (or a compound powder), or a silicon-tin alloy (or compound powder) may be used as a starting material (target) for film formation. Other elements such as carbon, germanium or tin, or a compound or alloy of these elements, may be used. A reactive film-forming method carried out in an atmosphere of fluorine or chlorine is convenient. After film formation, the film may be converted to a silicon halide by treatment with a halogen. Preferably, a film-forming temperature of at least 500° C. may be used under conditions where the surface of the film is coated with halogen atoms. Film formation in an atmosphere of an inert gas, a hydrocarbon or an oxygen gas does not impair the objects of the invention. Specific film-forming conditions are a gas flow rate of 1 to 100 sccm, and a reaction pressure of 0.001 mtorr to 10 mtorr. Depending upon the film-forming speed, film-forming conditions such as the flow rate, the pressure and the power may be properly selected. The film-forming temperature (substrate temperature) is not basically restricted. The temperature is preferably preset by bringing it into conformity to the dehalogenation-hydrogenation reaction. Specifically, a temperature of not more than 500° C. may be selected.

A specific example of the CVD method will be shown below.

As a starting gas for film formation, usable are a mixed gas of a silane compound of the formula $Si_nH_{2n+2}$ such as monosilane, disilane, trisilane or tetrasilane and a halogen gas such as chlorine or fluorine; a halogenated silane such as monofluorosilane, difluorosilane, trifluorosilane, tetrafluorosilane, monochlorosilane, dichlorosilane or trichlorosilane; a gaseous mixture of hydrogen and such a halogenated silane; and a gaseous mixture of these with organosilane, hydrocarbons, etc. Hydrogen, helium, argon, neon, nitrogen, etc. may be introduced together with the starting gas. These subsidiary gases may be used effectively in a volume ratio of 0.01 to 100% based on the volume of the starting gas. The proportion of the gas may be properly selected by considering the film-forming speed or the film properties such as the amount of hydrogen.

The film-forming conditions are not particularly limited, as in the case of the physical film-forming method. Specific conditions will be described below.

In the case of the photo CVD method, the starting gas is decomposed and formed into a film by using ultraviolet sources having a wavelength of not more than 350 nm such as a low pressure mercury lamp, a deuterium lamp or a rare gas lamp. The preferred conditions for film formation are a gas flow rate of 1 to 100 sccm, a reaction pressure of 15 mtorr to atmospheric pressure, and a substrate temperature of from room temperature to 600° C. The preferred substrate temperature, when considered from the viewpoint of the film-forming time and the temperature of the dehalogenation-hydrogenation step that can be conceived from the thermal resistance and the film-forming speed of the substrate, is 300° to 500° C.

In the plasma CVD method, high-frequency discharge, direct-current discharge, microwave discharge or ECR discharge may be effectively used as a method of discharging. Sufficient conditions are a starting gas flow rate of 1 to 900 sccm, a reaction pressure of 0.001 mtorr to atmospheric pressure, and a power of 1 mW/cm$^2$ to 10 W/cm$^2$. These film-forming conditions may be properly changed according to the film-forming speed and the method of discharging. The substrate temperature is preferably room temperature to 600° C., and more preferably 300° to 500° C.

In the present invention, the dehalogenation-hydrogenation step of the formed semiconductor film is performed by introducing a silane compound into the dehalogenation-hydrogenation chamber, and applying heat, light or ionization to it. When heat is used, the temperature of the substrate is 400° to 600° C., preferably 400° to 500° C. In the case of light irradiation or ionic bombardment, the temperature of the substrate is from room temperature to 600° C., preferably 200° to 450° C., which can be lowered as compared with the case of using only heat.

A silicon hydride such as monosilane, disilane, or trisilane can be effectively used as the silane compound.

Dehalogenation-hydrogenation by light irradiation is especially preferred. To induce this de-halogenated-hydrogenation reaction effectively, it is preferred to make the pressure in the film-forming chamber low. The dehalogenation-hydrogenation reaction is performed by irradiating light to the surface of the silicon halide in an atmosphere of silane. The temperature of the substrate is from room temperature to 600° C., preferably from 200° to 450° C. The reaction pressure is 1 mtorr to 1 torr, more preferably 10 mtorr to 100 mtorr. To perform the dehalogenation-hydrogenation reaction effectively, the light is preferably supplied from a low-pressure mercury lamp, a rare gas discharge lamp, an ultraviolet laser, a deuterium lamp, an Xe pulse lamp, a visible light laser or a carbon dioxide laser.

The dehalogenation-hydrogenation reaction in this invention is especially effective under low pressures, and light other than ultraviolet light can be effectively utilized. It should be understood therefore that it differs in technical scope from the photo CVD in the prior art. The irradiation time may be suitably selected according to the rate of forming the film.

In one film-forming step, a film having a thickness of not more than 100 Å and at least 1 Å is preferably formed. Film thickness below 100 Å is controlled by the film-forming time. Since the film-forming rate is about 0.1 to 30 Å/sec., if the film thickness exceeds 100 Å, the effect of the dehalogenation-hydrogenation step to be subsequently carried out decreases. If the film thickness obtained by one film-formation step is made very thin, for example, less than 1 Å, the effect of the invention is not impaired, but the number of repetitions must be increased to several thousand. The time required for each cycle is not particularly limited, but preferably within 1000 seconds. The time required for shifting from the film-forming step to the dehalogenation-hydrogenation step, and the time required for shifting from the dehalogenation-hydrogenation step to the film-forming time are preferably as short as possible. The film thickness is not limited, but is about 10 Å to 10 micrometers. This time depends upon the shape and size of the device and the evacuating system, but specifically can be shortened to within 30 seconds.

In a preferred embodiment of this invention, the silicon film is formed by growing the silicon film from one to several layers thick by repeating the dehalogenation-hydrogenation step by coating of halogen on the surface of the film, dehalogenation-hydrogenation of it with silane, coating of halogen on the film surface and dehalogenation-hydrogenation by silane. The resulting silicon film has very few silane microvoids and has a high density.

The substrate on which the semiconductor film is formed is not limited except that it should withstand the processing temperature of this invention. It may be formed of a transparent material such as soda lime glass, borosilicate glass or quartz glass, metals, ceramics and thermally stable polymeric materials may be used as a substrate. A substrate on which an electrode is formed, which can be used in a solar cell or a sensor, may also be effectively used in this invention.

Now, the previously mentioned method involving using a halogenated silane gas will be described. Specifically, a hydrogenated silicon semiconductor film is formed by a physical film-forming method such as vacuum evaporation, sputtering or ion plating, or a chemical vapor deposition method (CVD such as photo CVD or plasma CVD. In the dehalogenation-hydrogenation step, the surface of the film formed is coated with hydrogen, a halogenated silane is introduced, and by applying heat, light, or ionization, the dehalogenation-hydrogenation is allowed to proceed to bond silicon atoms to the film.

It is essential in this invention to repeat the film-forming step and the dehalogenation-hydrogenation step. Preferably by one cycle of repetition, the thickness of the semiconductor film is increased to not more than 100 Å and at least 1 Å. Other film-forming conditions do not particularly impair the effects of the invention.

An effective physical film-forming method will be described below.

As a starting material (target) for physical film formation, an element, a compound or an alloy, for example, silicon, silicon carbide, silicon nitride, silicon-germanium alloy (or compound powder) or silicontin alloy (or a compound powder) may be used. A reactive film-forming method in a hydrogen atmosphere is convenient. After the film-formation, the film may be converted to a hydrogenated semiconductor film by treating it with hydrogen. Preferably, under such conditions while the film surface is coated with hydrogen, a film forming temperature of not more than 500° C. may be employed. Film formation in an atmosphere of an inert gas, hydrogen, hydrocarbon, fluorine or oxygen gas does not impair the objects of this invention. Specific conditions include a gas flow rate of 1 to 100 sccm, a reaction pressure of 0.001 mtorr to 10 mtorr. According to the rate of film-formation, the film-forming conditions such as the flow rate, the pressure and the power may be properly selected. The film-forming temperature (substrate temperature) is not basically restricted. But preferably, the temperature is preset to bring it into conformity with the dehalogenation-hydrogenation step. Specifically, temperatures of 500° C. or below may be chosen.

A specific example of an effective CVD method will be illustrated below.

As a starting gas for film formation, a silane compound of general formula $Si_nH_{2n+2}$, where n is a natural number, such as monosilane, disilane, trisilane, or fluorosilane, organosilane, hydrocarbon, germanium or germanium fluoride may be used singly or in combination. The starting gas may be introduced together with such gases as hydrogen, fluorine, chlorine, helium, argon, neon and nitrogen. When these gases are used, it is effective to use them in a volume ratio of 0.01 to 100% based on the starting gas. The proportion of these gas may be properly selected in view of the film-forming temperature or the properties (such as the amount of hydrogen) of the film.

The film-forming conditions as in the physical film-forming method are not limited. Specific conditions will be described below. In the case of photo CVD, the starting gas is decomposed by using ultraviolet light sources having a wavelength of not more than 350 nm, such as a low-pressure mercury lamp, a deuterium lamp or a rare gas lamp, and film formation is carried out. The film forming conditions include a gas flow rate of 1 to 100 sccm and a reaction pressure of 15 mtorr to atmospheric pressure. The preferred substrate temperature is room temperature to 600° C. The preferred substrate temperature, in view of the film-forming rate and the temperature of the dehalogenation-hydrogenation step that can be considered from the heat resistance and film-forming rate of the substrate, is 300° to 500° C.

In the case of plasma CVD, high-frequency discharge, microwave discharge and ECR discharge may be used as an effective method of discharging. Other conditions include a starting gas flow rate of 1 to 900 sccm, a reaction pressure of 0.001 mtorr to atmospheric pressure, and an electric power of 1 $mW/cm^2$ to 10 $mW/cm^2$. These film-forming conditions are properly changed according to the film-forming rate and the method of discharging. The substrate temperature is preferably room temperature to 600° C., more preferably 300° to 500° C.

In the present invention, the dehalogenation-hydrogenation step of the semiconductor film formed is performed by introducing a halogenated silane into the dehalogenated-hydrogenating chamber, and applying heat, light or ionization. When heat is used, the substrate temperature is 400° to 600° C., preferably 400° to 500° C. In the case of light irradiation or ion bombardment, the substrate temperature is from room temperature to 600° C., preferably 200° to 450° C., which may be lower than in the case of using heat. To use heat, light and ion bombardment in combination is a preferred means. To induce the de-halogenated-hydrogenation reaction with a good efficiency, the pressure of the de-halogenated-hydrogenating chamber is preferably reduced. It is in the range of 1 mtorr to 1 torr, more preferably 10 mtorr to 100 mtorr.

The conditions for performing dehalogenation-hydrogenation while light irradiation is being carried out are substantially the same as the above-mentioned method which is carried out in an atmosphere of silane.

Halogenated silane used in the dehalogenation-hydrogenation step are compounds resulting from substituting the hydrogen of silicon hydride (abbreviated as silane) by halogen, and include, for example, halogenated silanes, halogenated disilanes, halogenated trisilane. The effective halogen atoms are fluorine, chlorine and bromine. Specific examples include monofluorosilane, difluorosilane, trifluorosilane, monochlorosilane, dichlorosilane, trichlorosilane, monofluorodisilane, difluorodisilane, monochlorodisilane and dichlorodisilane.

In one film-forming step, a film having a thickness of not more than 100 Å and at least 1 Å is preferably formed. Thicknesses of 100 Å or below may be controlled by the film-forming time. Since the film-forming rate is about 0.1 to 30 Å/sec., film formation may, for example, take about 3 seconds to 1000 seconds. When the film thickness exceeds 100 Å, the dehalogenation-hydrogenation step to be carried out next has a reduced effect. When the thickness for one film formation cycle is very thin, for example less than 1 Å, the effect of the present invention is not impaired, but the number of repetitions should be increased to several thousand. The time required for one cycle is not a requirement which has to be limited particularly, but is preferably within 1000 seconds. The time required to shift from the film-forming step to the dehalogenation-hydrogenation and the time required for shifting from the dehalogenation-hydrogenation step to the film-forming step are preferably as short as possible. This time depends upon the shape and size of the device and the vacuum evacuating system. Specifically, the time may be shortened to less than 30 seconds. The film-forming step and the dehalogenation-hydrogenation step may be carried out in the same reaction chamber, or in separate chambers. The effect of the invention is not impaired if they are carried out either way. The film thickness is not particularly limited, and usually is about 10 Å to 10 micrometers.

In a preferred embodiment of this invention, by repeating hydrogen coating of the surface of the film, dehalogenation-hydrogenation by a halogenated silane, and coating of hydrogen on the surface of the film and dehalogenation-hydrogenation with a halogenated silane, a silicon film is formed to a thickness of from one to several atomic layers. The thus-obtained silicon film has very few microvoids and has a high density.

The substrate on which the semiconductor film is formed is not limited except that it can withstand the processing temperature of this invention. It may be any of transparent materials such as soda lime glass, borosilicate glass or quartz glass, metals, ceramics or thermally stable polymeric materials. Substrates having electrodes formed thereon, which may be used in solar cells or sensors, may be effectively used in this invention.

EXAMPLE 15

The apparatus shown in FIG. 6 was used. This apparatus consists of a film-forming chamber 1 and a dehalogenating-hydrogenating chamber 2. The film-forming chamber has a discharging device for depositing a halogenated silicon semiconductor film. These two chambers were connected by a conveying device 13. The substrate continuously moved to and from the two chambers and was repeatedly subjected to film-formation and treatment. As a starting material, a gaseous mixture of trichlorosilane and hydrogen was introduced through a flow meter 9 in an amount of 10 sccm. The temperature of the substrate 10 was preset at 300° C. which was the temperature during the subsequent dehalogenation-hydrogenation. At a pressure of 0.08 torr in the reaction chamber, a high-frequency electric power of 10 W was applied to form an Si film to a thickness of about 40 Å on the substrate. After film-formation, the substrate was transferred to the dehalogenation-hydrogenating chamber within 60 seconds. Disilane was introduced into the dehalogenation-hydrogenating chamber. While ultraviolet light was irradiated by the ultraviolet lamp 22 at a reaction pressure of not more than 0.1 torr, the hydrochlorinated Si film was exposed to the ultraviolet light for 30 seconds. The substrate was returned to the film-forming chamber. The film-forming step-dehalogenation-hydrogenation step were repeated under the same conditions. By 100 repetitions of these steps, a film having a thickness of 4000 Å was obtained. A quartz glass substrate and a single crystal Si substrate were used as the substrate. The optical properties of the Si film formed on the quartz substrate were measured. A metallic electrode was formed on part of it, and its electrical properties were measured. The sample formed on the single crystal Si substrate was measured by infrared absorption spectroscopy to estimate the amount of bound hydrogen. This amount of bound hydrogen was further confirmed by secondary ion mass spectrometory (SIMS).

The resulting Si film had the following properties. Optical band gap 1.65 eV under an irradiation of a pseudo-solar light (AM-1.5) at an intensity of 100 mW/cm$^2$, conductivity (photo conductivity) $1 \times 10^{-4}$ S/m; dark conductivity $8 \times 10^{-11}$ S/cm; activation energy 0.8 eV; and the amount of bound hydrogen 5 at %.

To examine the light stability of this Si film, a pseudo-solar light (AM-1.5) was continuously irradiated at an intensity of 100 mW/cm$^2$ for 20 hours, and the change in photo conductivity was observed. The change in photo conductivity 20 hours later versus the photo conductivity during the initial stage was about 7%. It was found that the film had very high stability.

The characteristic feature of the present invention, as can be seen from this Example, is that in spite of the low amount of hydrogen, the film had high light sensitivity, and its percent light deterioration was small.

EXAMPLE 16

In Example 16, the film thickness and the dehalogenation-hydrogenation time were changed respectively to about 3 Å and 6 seconds. The film thickness was changed by changing the film-forming time. Since in Example 15 it was found that the film-forming speed by sputtering was about 1 Å/sec., in this Example the film-forming time or single film-formation time was adjusted to 3 seconds. By repeating the film-forming step and the dehalogenation-hydrogenation step 1350 times, a film having a thickness of 4000 Å was obtained.

The resulting film had the properties shown below when they were measured the same way as in Example 1.

Optical band gap 1.60 eV under irradiation of a pseudo-solar light (AM-1.5) at an intensity of 100 mW/cm$^2$, conductivity (photo conductivity) $3 \times 10^{-4}$ S/cm; dark conductivity $4 \times 10^{-11}$ S/cm; activation energy 0.81 eV; and the amount of bound hydrogen 3 at %.

To examine the light stability of the Si film, a pseudo-solar light (AM-1.5) was continuously irradiated for 20 hours at an intensity of 100 mW/cm$^2$ for 20 hours, and the change in photo conductivity was observed. The change in photo conductivity after 20 hours versus the initial photo conductivity was not more than 5%, and it was found that the film had very high stability.

The present Example was very effective although the number of film formation-dehalogenation-hydrogenation cycles was as high as 13.5 times that in Example 15.

EXAMPLE 17

In Example 17, monosilane was used as the silane and ultraviolet light was irradiated. The same measurement as in Example 15 was made to obtain the following results. Optical band gap 1.76 eV under irradiation of a pseudo-solar light (AM-1.5) at 100 mW/cm$^2$, conductivity (photo conductivity) $4 \times 10^{-5}$ S/cm; dark conductivity $5 \times 10^{-10}$ S/cm; activation energy 0.88 eV; and the amount of bound hydrogen 10 at %.

A pseudo-solar light (AM-1.5) was irradiated continuously for 20 hours at an intensity of 100 mW/cm$^2$, and the change in photo conductivity was observed. The change of photo conductivity after 20 hours versus the photo conductivity during the initial stage was about 8%, and it was found that the film had very high stability.

EXAMPLE 18

The apparatus shown in FIG. 7 including a film-forming chamber provided with a discharge tube capable of irradiation of ultraviolet light was used. A mixture of trifluorosilane and disilane was used as a starting material. At a pressure of 0.15 torr and a substrate temperature of 300° C., ultraviolet light having a wavelength of 253 nm was irradiated by an ultraviolet light generating device. The dehalogenation-hydrogenation step was carried out in the same way as in Example 15 except that in Example 15, a xenon pulse light was irradiated from a xenon flash lamp 23.

The properties of the film obtained by this method were as follows. Under irradiation of a pseudo-solar light (AM-1.5) at an intensity of 100 mW/cm$^2$, conductivity (photo conductivity) $1 \times 10^{-4}$ S/cm; dark conductivity $1 \times 10 -10$ S/cm; optical band gap 1.65 e; activation energy 0.83 eV; and the amount of bound hydrogen 5 at %.

To examine the light stability of this Si film, a pseudo-solar light (AM-1.5) was continuously irradiated for 20 hours at an intensity of 100 mW/cm$^2$ for 20 hours, and the change in photo conductivity was observed. The change in photo conductivity after 20 hours versus the photo conductivity during the initial stage was about 7%. It was found that the film had very high stability.

COMPARATIVE EXAMPLE 5

In Comparative Example 5, a halogenated silicon film was formed and then without going through a dehalogenation-hydrogenation step, the film was grown to a thickness of 4000 Å. The properties of the film obtained by this method were: Photo conductivity $6 \times 10^{-6}$ S/cm; dark conductivity $6 \times 10^{-9}$ S/cm; and the amount of bound hydrogen 11 at %. The properties of this film were extremely lower than the properties of the film of Example 15.

COMPARATIVE EXAMPLE 6

In Comparative Example 6, a Si film was formed to a thickness of 4000 Å, and then the dehalogenation-hydrogenation step was carried out for a time of 1200 seconds. The properties of the film obtained by this method were photo conductivity $2 \times 10^{-5}$ S/cm; dark conductivity $1 \times 10^{-9}$ S/cm; and the amount of bound hydrogen 11 at %. These film properties were lower than those shown in Example 15, and were the same as those of a Si film obtained by a conventional glow discharge method or a photo CVD method. When the photo stability of this film was measured, the change in photo conductivity after 20 hours was 90%, which was about the same degree as a conventional Si film.

EXAMPLE 19

The apparatus shown in FIG. 8 was used. This apparatus was comprised of a film-forming chamber 1 and a dehalogenation-hydrogenating chamber 2 equipped with a halogen atom generating means, and the film-forming chamber 1 had a sputtering device for depositing a semiconductor film. These two chambers were connected by a conveying device 13. The substrate continuously moved between the two chambers. Thus, steps of deposition, halogenation and dehalogenation-hydrogenation can be repeated. The sputtering was performed in accordance with a high-frequency magnetron sputtering method. As a starting material, a high-purity silicon target 3 was placed on cathode, and a mixture of argon and chlorine (10 sccm) was introduced through a flow meter 9. The temperature of the substrate was set at 300° C. which was the temperature of the subsequent dehalogenation-hydrogenation step. At a pressure of 0.6 mtorr in the film-forming chamber, a high-frequency power (100 W) was applied to perform sputtering for several seconds and thereby several atomic layers of Si were deposited. Then, the substrate was transferred to the dehalogenation-hydrogenation chamber 2, and halogen atoms were introduced to perform halogenation of the surface. Disilane was introduced, and under a pressure of 0.01 torr, ultraviolet light was irradiated from a low pressure mercury lamp. The Si halide film was exposed to the ultraviolet for 10 seconds. Again in the film-forming chamber 1, sputtering was carried out for several seconds to deposit several atomic layers of Si. In the chamber 2, halogen atoms were introduced to perform halogenation of the surface. Then, disilane was introduced to perform dehalogenation-hydrogenation. Thus, the deposition step-dehalogenation-hydrogenation steps were repeated under the same conditions to give a film having a thickness of about 4000 Å. A quartz substrate and a single crystal Si substrate were used as the substrate. The optical properties of the Si film formed on the quartz substrate were measured, and a metallic electrode was formed on part of it, and its electrical properties were measured. The film formed on the single crystal Si substrate was analyzed by infrared absorption spectrum measurement, and the amount of bound hydrogen was calculated. This amount of bound hydrogen was further confirmed by secondary ion mass spectrometory (SIMS).

The properties of the obtained Si film were as follows: Optical band gap 1.68 eV under irradiation of a pseudo-solar light (AM-1.5) at an intensity of 100 mW/cm$^2$ photoconductivity, activation energy 0.84 eV; and the amount of bound hydrogen 6 at %.

To examine the light stability of this Si film, a pseudo-solar light (AM-1.5) was continuously irradiated for 20 hours at an intensity of 100 mW/cm$^2$ for 20 hours, and the change in photo conductivity was observed. The change in photo conductivity 20 hours later versus the photo conductivity in the initial stage was about 8%. It was found that the film had very high stability.

It is clearly seen from the results of this Example that the present invention is characterized by the fact that in spite of its low amount of hydrogen, the resulting film had high light sensitivity and a small light deterioration percentage.

EXAMPLE 20

Figure 9:
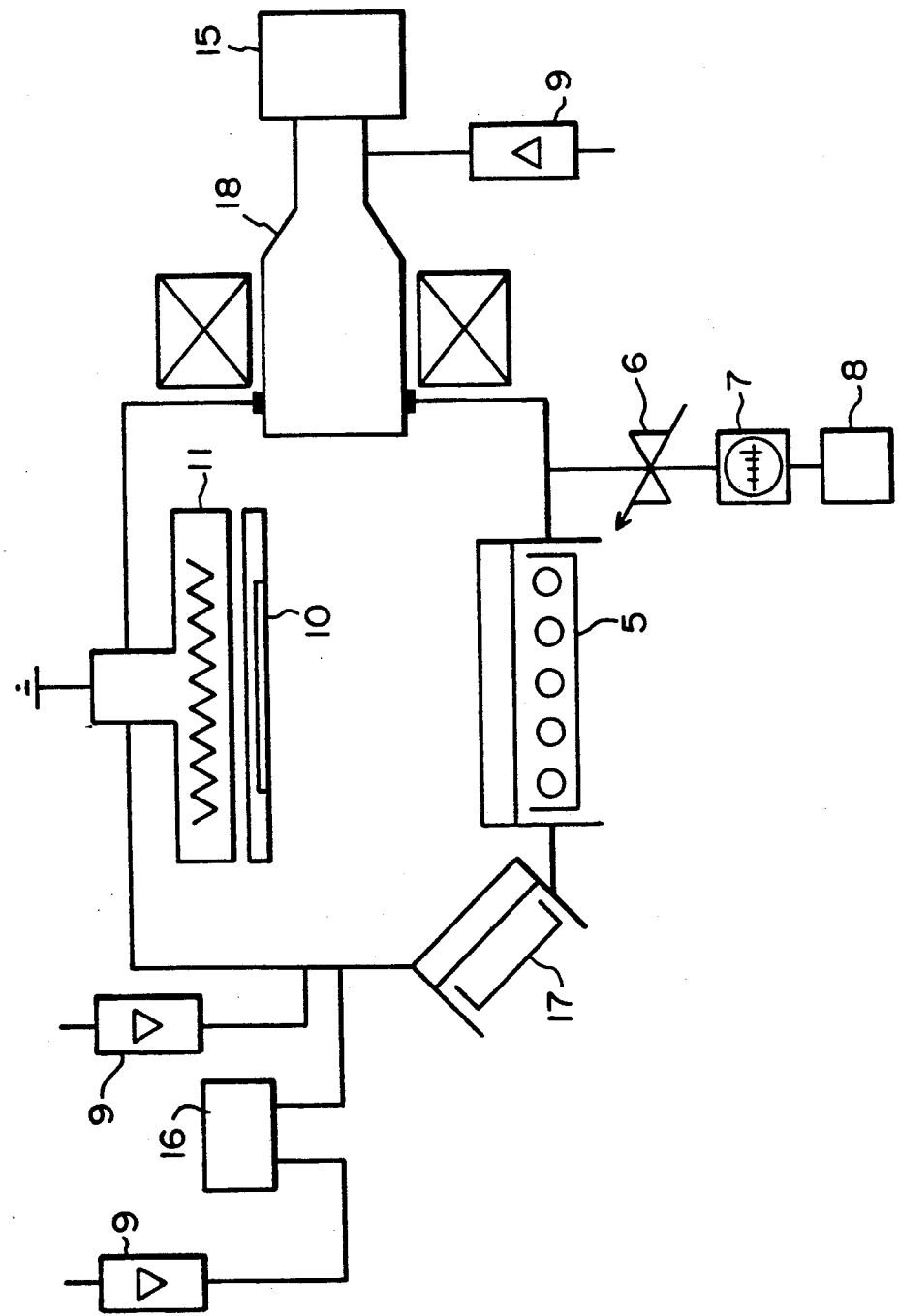
FIG. 9 is a schematic view showing another example of a film-producing device for practicing the present invention.

The apparatus shown in FIG. 9 was used. In this apparatus, one chamber was used both as a film-formation chamber and a dehalogenation-hydrogenating chamber. A substrate 10 was positioned, and then monochlorosilane and monosilane were introduced. By photo CVD with mercury sensitization, chlorinated silicon was formed. The supply of mercury vapor was stopped, and by electron cyclotron resonance (ECR) discharge, chlorine atoms were generated and supplied to the surface of chlorinated silicon. Then, disilane was introduced under a pressure of 10 mtorr, and a dehalogenation-hydrogenation was carried out under irradiation of a low-pressure mercury lamp 22. By repeating the supply of chlorine atoms, the introduction of disilane and the dehalogenation-hydrogenation reaction, a film having a thickness of about 4000 Å was obtained. The film was evaluated by the same method as in Example 19. The results were optical band gap 1.65 eV under a pseudo-solar light (AM-1.5) at an intensity of 100 mW/cm$^2$, conductivity (photo conductivity) $2 \times 10^{-4}$ S/cm; dark conductivity $6 \times 10^{-11}$ S/cm; activation energy 0.82 eV; and the amount of bound hydrogen 4 at %.

To examine the light stability of this Si film, a pseudo-solar light (AM-1.5) was continuously irradiated at an intensity of 100 mW/cm$^2$ for 20 hours, and the change in photo conductivity was observed. The change in photo conductivity 20 hours later versus the photo conductivity during the initial stage was not more than 5%. It was found that the film had very high stability.

EXAMPLE 21

In Example 21, disilane was used instead of monosilane used in Example 20 in a mixture with monochlorosilane. By direct photo CVD without using mercury vapor, chlorinated silicon was formed. Disilane was used as a silane, and the dehalogenation-hydrogenation was performed by irradiating an Xe pulse light by means of a xenon flash lamp 23. The same measurement as in Example 19 was performed. The results were optical band gap 1.78 eV under an irradiation of a pseudo-solar light (AM-1.5) at an intensity of 100 mW/cm$^2$, conductivity (photo conductivity) $3 \times 10^{-5}$ S/cm; dark conductivity $4 \times 10^{-10}$ S/cm; activation energy 0.88 eV; and the amount of bound hydrogen 10 at %.

To examine the light stability of this Si film, a pseudo-solar light (AM-1.5) was continuously irradiated for 20 hours at an intensity of 100 mW/cm$^2$ for 20 hours, and the change in photo conductivity was observed. The change in photo conductivity 20 hours later versus the photo conductivity in the initial stage was about 9%. It was found that the film had very high stability.

EXAMPLE 22

An experiment was conducted using the apparatus shown in FIG. 10. Instead of sputtering, a film-forming chamber 1 was used. A mixture of hexafluorodisilane and disilane was used as a starting material, and at a pressure of 0.05 torr, a substrate temperature of 300° C. and an RF discharge power of 20 W, a film having several atomic layers was formed during each film-forming step. The dehalogenation-hydrogenation step was performed as in Example 19.

The film obtained by this method had the following properties. Under irradiation of pseudo-solar light (AM-1.5) at an intensity of 100 mW/cm$^2$, conductivity (photo conductivity) $6 \times 10^{-5}$ S/cm; dark conductivity $9 \times 10^{-11}$ S/cm; optical band gap 1.70 eV; activation energy 0.84 eV; and the amount of bound hydrogen 7 at %.

To examine the light stability of this Si film, a pseudo-solar light (AM-1.5) was continuously irradiated for 20 hours at an intensity of 100 mW/cm$^2$ for 20 hours, and the change in photo conductivity was observed. The change in photo conductivity 20 hours later versus the photo conductivity during the initial stage was about 8%. It was found that the film had very high stability.

EXAMPLE 23

An experiment was conducted using the apparatus shown in FIG. 11. This apparatus consisted of a film-forming chamber 1 and a dehalogenation-hydrogenating chamber 2. The film-forming chamber 1 had a sputtering device for depositing a hydrogenated silicon semiconductor film. These two chambers were connected by a conveying device 13, and the substrate can continuously move between these chambers to repeat film-formation and treatment. Sputtering was carried out by a high-frequency magnetron sputtering method. As a starting material, a high-purity silicon target 3 was placed on the cathode, and a gaseous mixture of argon and hydrogen was introduced at as rate of 10 sccm through a flow meter. The substrate was set at a temperature of 300° C., the temperature of the subsequent dehalogenation-hydrogenation. At a pressure of 0.6 mtorr in the film-forming chamber, a high-frequency power of 100 W was applied to form an Si film having a thickness of about 40 Å on the substrate. Within 60 seconds after film formation, the substrate was transferred to the dehalogenating-hydrogenating chamber. In the dehalogenating-hydrogenating chamber, monochlorosilane was introduced, and while ultraviolet light was irradiated under a pressure of 0.01 torr, the hydrogenated silicon film was exposed to irradiation of ultraviolet light for 30 seconds. Again, the substrate was returned to the film-forming chamber, and the film-forming step and the dehalogenation-hydrogenation step were repeated under the same conditions. By repeating them 100 times, a film having a thickness of about 4000 Å was formed. As the substrate, a quartz glass substrate and a single crystal Si substrate were used. The optical properties of the Si film formed on the quartz plate were measured, and a metallic electrode was formed on part of it, and its electrical properties were measured. The sample formed on the single crystal Si substrate was measured by infrared absorption spectrum to estimate the amount of bound hydrogen. This amount of bound hydrogen was further confirmed by secondary ion mass spectrometry (SIMS).

The properties of the resulting Si film were as follows: Optical band gap 1.68 eV under irradiation of a pseudo-solar light (AM-1.5) at an intensity of 100 mW/cm$^2$, conductivity (photo conductivity) $9 \times 10^{-5}$ S/cm; dark conductivity $7 \times 10^{-11}$ S/cm; activation energy 0.84 eV: and the amount of bound hydrogen 6 at %.

To examine the photo stability of this Si film, a pseudo-solar light (AM-1.5) was continuously irradiated for 20 hours at an intensity of 100 mW/cm$^2$ for 20 hours, and the change in photo conductivity was observed. The change in photo conductivity 20 hours later versus the photo conductivity during the initial stage was about 8%. It was found that the film had very high stability.

It is clearly seen from the results of this Example that the present invention is characterized by the fact that in spite of its low amount of hydrogen, the resulting film had high light sensitivity and a small light deterioration ratio.

EXAMPLE 24

In Example 24, the film thickness and the dehalogenation-hydrogenation time were respectively changed to about 3 Å and 6 seconds. The thickness of the film was changed by changing the film-forming time. Since in Example 23 it was found that the rate of film formation by sputtering was about 1 Å/sec., in the present Example, the time for a single film-formation step was adjusted to 3 seconds. By repeating the film-forming step and the dehalogenation-hydrogenation step 1350 times, a film having a thickness of about 4000 Å was obtained. The same measurement as in Example 23 was performed, and the following results were obtained. Optical band gap 1.65 eV; under an irradiation of a pseudo-solar light (AM-1.5) at an intensity of 100 mW/cm$^2$, conductivity (photo conductivity) $2 \times 10^{-4}$ S/cm; dark conductivity $6 \times 10^{-11}$ S/cm; activation energy 0.82 eV; and the amount of bound hydrogen 4 at %.

To examine the light stability of the Si film, a pseudo-solar light (AM-1.5) was irradiated at an intensity of 100 mW/cm$^2$ for 20 hours continuously, and the change in photo conductivity was observed. The change in photo conductivity 20 hours later versus the initial stage photo conductivity was not more than 5%, and it was found that the film had very high stability.

In this Example, the number of cycles of film-formation and dehalogenation-hydrogenation was more than 13.5 times that in Example 23, but the operations in this Examples were very effective.

EXAMPLE 25

In Example 25, monofluorosilane was used as the halogenated silane. The same measurement as in Example 23 was performed, and the following results were obtained. Optical band gap 1.78 eV under an irradiation of a pseudo-solar light (AM-1.5) at an intensity of 100 mW/cm$^2$, conductivity (photo conductivity) $3 \times 10^{-5}$ S/cm; dark conductivity $4 \times 10^{-10}$ S/cm; activation energy 0.88 eV; and the amount of bound hydrogen 10 at %.

To examine the light stability of this Si film, a pseudo-solar light (AM-1.5) was continuously irradiated for 20 hours at an intensity of 100 mW/cm$^2$, and the change in photo conductivity was observed. The change in photo conductivity 20 hours later versus the photo conductivity in the initial stage was about 9%. It was found that the film had very high stability.

EXAMPLE 26

An experiment was conducted using the apparatus shown in FIG. 12. Instead of performing sputtering, a CVD film-forming method was performed by using a film-forming chamber having a discharge electrode. Disilane was used as a starting material, and at a pressure of 0.05 torr, a substrate temperature of 300° C. and a RF discharge power of 20 W, a film having a thickness of 100 Å was formed in one film-forming step. The dehalogenation-hydrogenation step was performed as in Example 23 except that a xenon pulse light was irradiated from a xenon flash lamp 23.

The properties of the film obtained as above were as follows: under an irradiation of a pseudo-solar light (AM-1.5) at an intensity of 100 mW/cm$^2$, conductivity (photo conductivity) $8 \times 10^{-9}$ S/cm; dark conductivity $9 \times 10^{-11}$ S/cm; optical band gap 1.70 e; activation energy 0.84 eV; and the amount of bound hydrogen 7 at %.

To examine the light stability of this Si film, a pseudo-solar light (AM-1.5) was continuously irradiated for 20 hours at an intensity of 100 mW/cm$^2$ for 20 hours, and the change in photo conductivity was observed. The change in photo conductivity 20 hours later versus the photo conductivity during the initial stage was about 8%. It was found that the film had very high stability.

COMPARATIVE EXAMPLE 7

In Comparative Example 7, the Si film was formed to a thickness of 200 Å, which exceeds the 100 Å prescribed in this invention. Then a dehalogenation-hydrogenation step was carried out for 60 seconds. After 20 repetitions, a film having a thickness of 4000 Å was formed. The properties of the film obtained by this method were a photo conductivity of $2 \times 10^{-5}$ S/cm, a dark conductivity of $1 \times 10^{-9}$ S/cm and a bound hydrogen amount of 11 at %. The properties of this film were lower than those of the film shown in Example 23, and were the same as an Si film obtained by a conventional glow discharge method or photo CVD method. When the light stability of this film was measured, the change in photo conductivity was about 90% as in a conventional Si film.

EXAMPLE 27

The apparatus shown in FIG. 8 was used. It was comprised of a film-forming chamber 1 and a dehalogenated-hydrogenerating chamber 2 equipped with a hydrogen atom generating means. The film-forming chamber has a sputtering device for depositing a semiconductor film. These two chambers were connected by a conveyor device 13. The substrate 10 moved between two layers continuously, and the steps of deposition, hydrogenation reaction and dehalogenation-hydrogenation could be repeated. The sputtering was in accordance with a high frequency magnetron sputtering method. As a starting material, a high-purity silicon target 3 was placed on the cathode, and a gaseous mixture argon and hydrogen was introduced in an amount of 100 sccm through a flow meter 9. The substrate temperature was adjusted to 300° C., which was the temperature of the subsequent dehalogenation-hydrogenation step. Under a pressure of 0.6 mtorr in the film-forming chamber, a high frequency power of 100 W was applied to perform sputtering for several seconds to deposit several atomic layers of Si. Then, the substrate was transferred to the dehalogenation-hydrogenation step, and hydrogen atoms were introduced from the hydrogen atom generating device to hydrogenate the surface. Monochlorosilane was introduced, and while ultraviolet light was irradiated under a pressure of 0.01 torr, the halogenated silicon film was exposed for 10 seconds to ultraviolet irradiation. Back again in the film-forming chamber, several atomic layers of Si were deposited by sputtering for several seconds. In the dehalogenating-hydrogenating chamber 2, hydrogen atoms were introduced to perform hydrogenation of the surface. Then, monochlorosilane was introduced, and dehalogenation-hydrogenation was performed. Thus, the deposition step-dehalogenation-hydrogenation step were repeated under the same conditions to give a film having a thickness of about 400 Å. As the substrate, a quartz glass substrate and a single crystal Si substrate were used. The optical properties of the Si film formed on the quartz glass substrate were measured. A metallic electrode was formed on part of the film and its electrical properties were measured. The sample formed on the single crystal Si substrate was used to estimate the amount of a bound hydrogen by measurement of infrared absorption spectrum. The amount of bound hydrogen was confirmed by secondary ion mass spectrometory (SIMS).

The properties of the resulting Si film were as follows: Optical band gap 1.66 eV under irradiation of a pseudo-solar light (AM-1.5) at an intensity of 100 mW/cm$^2$, conductivity (photo conductivity) $1 \times 10^{-4}$ S/cm; dark conductivity $5 \times 10^{-11}$ S/cm; activation energy 0.82 eV; and the amount of bound hydrogen 5 at %.

To examine the light stability of the Si film, a pseudo-solar light (AM-1.5) was irradiated continuously at an intensity of 100 mW/cm$^2$, and the change in light conductivity was observed. The change of photo conductivity 20 hours later versus the photo conductivity in the initial stage was about 7%. It was found that the film had very high stability.

As is clear from the results of this Example, the characteristic feature of the invention is that the film obtained had high light sensitivity in spite of a small amount of hydrogen, and had a small light deterioration percentage.

EXAMPLE 28

An experiment was conducted using the apparatus shown in FIG. 9. In this apparatus, one chamber was used both as a film-forming chamber and a dehalogenated-hydrogenating chamber. After a substrate 10 was positioned, monosilane was introduced. Hydrogenated silicon was formed by photo CVD with mercury sensitization. The supply of a mercury vapor was stopped, and by an electron cyclotron resonance (ECR) discharging mechanism 26, hydrogen atoms were generated and fed onto hydrogenated silicon. Then, monochlorosilane was introduced and at a pressure of 10 mtorr, dehalogenation-hydrogenation was carried out under an irradiation of a low-pressure mercury lamp 22. The feeding of hydrogen atoms, the introduction of monochlorosilane and the dehalogenation-hydrogenation reaction were repeated to obtain a film having a thickness of about 400 Å. The film was evaluated by the same method as in Example 27. The results were optical band gap 1.63 eV under an irradiation of a pseudo-solar light (AM-1.5) at an intensity of 100 mW/cm$^2$, conductivity (photo conductivity) $3 \times 10^{-4}$ S/cm; dark conductivity $4 \times 10^{-11}$ S/cm; activation energy 0.80 eV; and the amount of bound hydrogen 3 at %.

To examine the light stability of the Si film, a pseudo-solar light (AM-1.5) was irradiated continuously at an intensity of 100 mW/cm$^2$, and the change in photo conductivity was observed. The change of photo conductivity 20 hours later against the photo conductivity in the initial stage was about 5% or less. It was found that the film has very high stability.

EXAMPLE 29

In Example 29, disilane was used instead of monosilane. Hydrogenated silicon was formed by direct photo CVD without using a mercury vapor. Monofluorosilane was used as the halogenated silicon, and the dehalogenation-hydrogenation was carried out by irradiating Xe pulse light from a xenon flash lamp 23. By making the same measurement as in Example 27, the following results were obtained. Optical band gap 1.76 eV; under irradiation of a pseudo-solar light (AM-1.5) at an intensity of 100 mW/cm, conductivity (photo conductivity) $3 \times 10^{-5}$ S/cm; drak conductivity $2 \times 10^{-10}$ S/cm; activation energy 0.86 eV; and the amount of bound hydrogen 9 at %.

To examine the light stability of the Si film, a pseudo-solar light (AM-1.5) was irradiated continuously at an intensity of 100 mW/cm$^2$, and the change in photo conductivity was observed. The change of photo conductivity 20 hours later versus the photo conductivity in the initial stage was about 8% or less. It was found that the film has very high stability.

EXAMPLE 30

An experiment was conducted using the apparatus shown in FIG. 10. Instead of performing sputtering, a film-forming chamber 1 equipped with a discharge electrode was used. Disilane was used as a starting material, and at a pressure of 0.05 torr, a substrate temperature of 300° C. and a discharge power of 20 W, a film having a thickness of 100 Å was formed in each film-forming step. The dehalogenation-hydrogenation step was carried out in the same way as in Example 27.

The film obtained by this method had the following properties: under an irradiation of a pseudo-solar light (AM-1.5) an intensity of 100 mW/cm$^2$, conductivity (photo conductivity) $9 \times 10^{-5}$ S/cm; dark conductivity $8 \times 10^{-11}$ S/cm; optical band gap 1.68 eV; activation energy 0.83 eV; and the amount of bound hydrogen 6 at %.

To examine the light stability of the Si film, a pseudo-solar light (AM-1.5) was irradiated continuously at an intensity of 100 mW/cm$^2$, and the change in photo conductivity 20 hours later versus the photo conductivity in the initial stage was about 8% or less. It was found that the film had very high stability.

We claim:
1. A method for forming an amorphous semiconductor film, which comprises the sequential steps of: (a) forming a silicon or silicon alloy semiconductor film having not more than 20 atomic percent of bound hydrogen, and then (b) modifying the formed film by exposing said film to a discharge atmosphere containing a non-film-forming reactive gas or a monovalent ion or atomic hydrogen, the sequence of steps being repeated multiple times, the thickness of the semiconductor film formed by one formation/modification cycle being in the range of from 10 to 1000 Å.

2. A method of claim 1 in which the film-forming step is carried out by a physical film-forming method selected from vacuum evaporation, sputtering, and ion plating.

3. A method of claim 2 in which a material selected from the group consisting of silicon, silicon carbide, silicon nitride, silicon-germanium alloy and silicon-tin alloy is used as a starting material for said physical film-forming method.

4. A method of claim 2 in which the film-forming step is carried out at a pressure of from 0.001 mtorr to 10 mtorr and a temperature of from room temperature to 500° C.

5. A method of claim 1 in which the film-forming step is carried out by a chemical film-forming method selected from photo CVD and plasma CVD.

6. A method of claim 3 in which a silane compound, silane fluoride, organosilane, or a mixture of these gases and a hydrocarbon is used as a starting gas for said chemical film-forming method.

7. A method of claim 5 in which the chemical film-forming method is photo CVD.

8. A method of claim 7 which is carried out at a pressure of from 15 mtorr to atmospheric pressure and a temperature of from 200° to 600° C.

9. A method of claim 5 in which the chemical film-forming method is plasma CVD.

10. A method of claim 9 which is carried out at a pressure of from 0.001 mtorr to atmospheric pressure and a temperature of from 200° to 600° C.

11. A method of claim 1 in which the semiconductor film is formed to a thickness of from 10 to 100 Å in one formation/modification cycle.

12. A method of claim 1 in which the amount of bound hydrogen is not more than 10%.

13. A method of claim 1 in which the modifying step is carried out by exposing the film to a discharge atmosphere containing a non-film-forming reactive gas.

14. A method of claim 13 in which the non-film-forming reactive gas is selected from hydrogen, hydrogen fluoride, fluorine, nitrogen trifluoride, and carbon tetrafluoride.

15. A method of claim 13 in which the modifying step by the non-film-forming reactive gas is carried out at a pressure of from 0.001 mtorr to atmospheric pressure.

16. A method of claim 1 in which the modifying step is carried out by exposing the film to a monovalent ion selected from hydrogen, fluorine, and chlorine.

17. A method of claim 16 in which the monovalent ion is generated by an ion generating device.

18. A method of claim 16 in which the modifying step of a monovalent ion is carried out at a pressure of from 0.001 mtorr to 10 torr and a temperature of from room temperature to 600° C. and with an ion energy of from 10 to 2000 eV.

19. A method of claim 1 in which the modifying step is carried out by exposing the film to atomic hydrogen.

20. A method of claim 19 in which the atomic hydrogen is generated by high frequency discharge, direct-current discharge, microwave discharge, ECR discharge, or a hot filament.

21. A method of claim 19 in which the modifying step with atomic hydrogen is carried out at a pressure of from 0.001 mtorr to atmospheric pressure and at a temperature of from room temperature to 600° C.

22. The method of claim 1 in which the final film thickness is 1000 Å to 10 micrometers.

23. The method of claim 1 in which the resulting film contains from 1 to 10 atomic percent of bound hydrogen.

24. A semiconductor film formed by the method of claim 1 on a substrate.

25. A method of forming an amorphous semiconductor film, which comprises the sequential steps of:
   (a) forming a silicon semiconductor film having not more than 20 atomic percent of bound hydrogen, and
   (b) de-halogenating/hydrogenating the formed film, the sequence of steps (a) and (b) each being repeated multiple times, the thickness of the semiconductor film formed by one formation/modification cycle being in the range of from 10 to 1000 Å.

26. A method of claim 25 in which the silicon semiconductor film is a halogenated amorphous silicon semiconductor film, and de-halogenation-hydrogenation is carried out by contacting the halogenated amorphous silicon semiconductor film with silane gas.

27. A method of claim 26 in which the de-halogenation-hydrogenation is carried out while irradiating with light.

28. A method of claim 25 in which the silicon semiconductor film is a hydrogenated amorphous silicon semiconductor film, and the de-halogenation/hydrogenation is carried out by contacting the amorphous silicon semiconductor film with halogenated silane gas.

29. A method of claim 28, in which the dehalogenation/hydrogenation is carried out while irradiating with light.

30. A semiconductor film formed by the method of claim 25 on a substrate.

* * * * *